(12) United States Patent
Kinoshita

(10) Patent No.: US 7,674,679 B2
(45) Date of Patent: *Mar. 9, 2010

(54) MANUFACTURING METHOD OF SEMICONDUCTOR DEVICE AND SEMICONDUCTOR DEVICE

(75) Inventor: Hideyuki Kinoshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 318 days.

This patent is subject to a terminal disclaimer.

(21) Appl. No.: 11/763,793

(22) Filed: Jun. 15, 2007

(65) Prior Publication Data

US 2007/0238248 A1 Oct. 11, 2007

Related U.S. Application Data

(62) Division of application No. 11/033,868, filed on Jan. 13, 2005, now Pat. No. 7,247,539.

(30) Foreign Application Priority Data

Sep. 28, 2004 (JP) ............................. 2004-282400

(51) Int. Cl.
*H01L 21/336* (2006.01)

(52) U.S. Cl. ............... 438/266; 257/300; 257/E21.646; 257/E21.662

(58) Field of Classification Search ............... 438/266; 257/300, E21.646, E21.662
See application file for complete search history.

(56) References Cited

U.S. PATENT DOCUMENTS

| 7,247,539 B2 * | 7/2007 | Kinoshita ............... 438/266 |
| 2003/0003664 A1 | 1/2003 | Takeuchi et al. |
| 2003/0210582 A1 | 11/2003 | Kinoshita |
| 2005/0199938 A1 | 9/2005 | Sakuma et al. |
| 2006/0081914 A1 | 4/2006 | Miwa |
| 2006/0091466 A1 | 5/2006 | Sugimae et al. |

FOREIGN PATENT DOCUMENTS

| JP | 2002-313970 | 10/2002 |
| JP | 2004-15056 | 1/2004 |

* cited by examiner

*Primary Examiner*—Asok K Sarkar
(74) *Attorney, Agent, or Firm*—Oblon, Spivak, McClelland, Maier & Neustadt, L.L.P.

(57) ABSTRACT

A manufacturing method of a semiconductor device disclosed herein, comprises: forming a first member to be patterned on a semiconductor substrate; patterning the first member to form a plurality of parallel linear patterns and a connecting portion which connects the linear patterns on at least one end side of the linear patterns; and removing the connecting portion.

10 Claims, 44 Drawing Sheets

MANUFACTURING METHOD OF SEMICONDUCTOR DEVICE AND SEMICONDUCTOR DEVICE

CROSS REFERENCE TO RELATED APPLICATION

This application is a divisional of and claims the benefit of priority under 35 USC §120 from U.S. Ser. No. 11/033,868, filed Jan. 13, 2005 and is based upon and claims the benefit of priority under 35 USC §119 from the Japanese Patent Application No. 2004-282400, filed on Sep. 28, 2004, the entire contents which is incorporated herein by reference.

BACKGROUND OF THE INVENTION

1. Field of the Invention

The present invention relates to a manufacturing method of a semiconductor device and the semiconductor device, and more particularly relates to a manufacturing method of a high-yield semiconductor device and the semiconductor device.

2. Related Background Art

With the recent advance of microfabrication technology, the minimum feature size of a semiconductor device becomes less than 100 nm, and the difficulty level of fabrication increases. A memory cell array of a NAND-type nonvolatile semiconductor memory device out of semiconductor devices has a structure in which the number of contacts per cell is reduced, and hence the layout of a wiring layer for word lines, bit lines, and so on becomes a layout such as line and space with minimum feature size which needs the most advanced microfabrication technology (For example, see Japanese patent Application Laid-open No. 2002-313970).

In the case of the aforementioned layout of the NAND-type nonvolatile semiconductor memory device, in a word line end portion on the side where potential is not lead to the wiring layer above the word line, there is a possibility that resist pattern collapse occurs with the progress of scale-down. It is known that this is caused by pattern thinning of a photoresist due to proximity effect, a problem in terms of shape, or ununiformity of drops of water remaining during rinse drying after development. It is also known that depending on fabrication conditions and processing contents, resist collapse occurs also during etching of a lower film beneath the photoresist with the photoresist as a mask.

This phenomenon has been hitherto handled by thinning the film thickness of the photoresist and so on, but to improve resolution, the film thickness of the photoresist has already been thinned to the limit of film thickness necessary for the fabrication of the lower film beneath the photoresist. Hence, the thickness of the photoresist cannot be easily thinned any more.

Therefore, in Japanese Patent Application Laid-open No. 2004-15056, the occurrence of resist pattern collapse can be prevented by extending an end portion of a word line in area, but an increase in layout pattern is inevitable.

Moreover, the aforementioned problem is not limited to the nonvolatile semiconductor memory device, and also may be a problem for other semiconductor devices.

SUMMARY OF THE INVENTION

In order to accomplish the aforementioned and other objects, according to one aspect of the present invention, a manufacturing method of a semiconductor device, comprises:

forming a first member to be patterned on a semiconductor substrate;

patterning the first member to for a plurality of parallel linear patterns and a connecting portion which connects the linear patterns on at least one end side of the linear patterns; and removing the connecting.

According to another aspect of the present invention, semiconductor device, comprises:

a semiconductor substrate;

a plurality of parallel linear patterns which are formed on the semiconductor substrate;

a connecting portion which is formed on the semiconductor substrate, wherein the connecting portion is provided on at least one end side of the linear patterns, and the connecting portion connected the linear patterns; and a separation pattern region which separates the linear patterns and the connecting portion.

DETAILED DESCRIPTION OF THE EMBODIMENTS

First Embodiment

In the first embodiment, a problem in a fabrication process such as resist pattern collapse or the like, which occurs in a region such as a memory cell array in a NAND-type nonvolatile semiconductor memory device requiring micro-wiring technology, is prevented by changing the pattern layout of the memory cell array, which makes it possible to realize a stable high yield. Further details will be given below.

Figure 1:
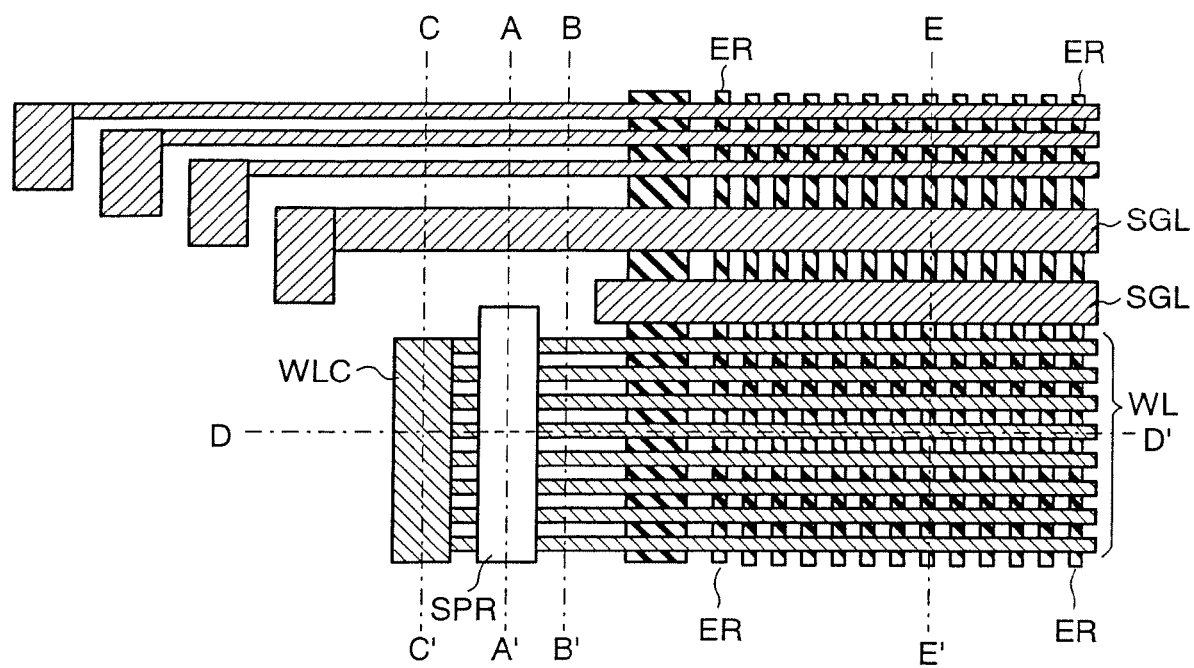
FIG. 1 is a plan view showing the structure of a nonvolatile semiconductor memory device according to a first embodiment.
Figure 2:
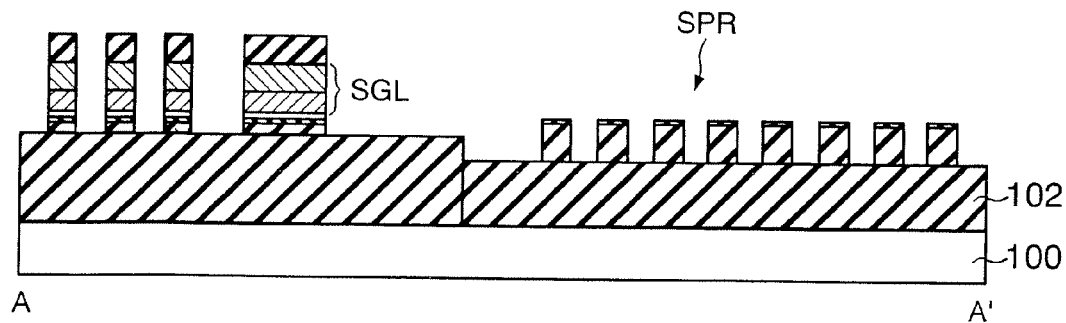
FIG. 2 is a sectional view taken along the line A-A' of FIG. 1 showing the structure of the nonvolatile semiconductor memory device according to the first embodiment.
Figure 3:
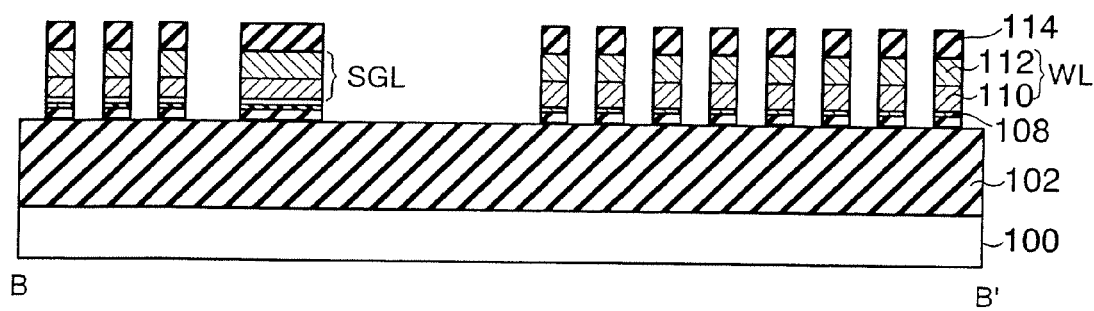
FIG. 3 is a sectional view taken along the line B-B' of FIG. 1 showing the structure of the nonvolatile semiconductor memory device according to the first embodiment.
Figure 4:
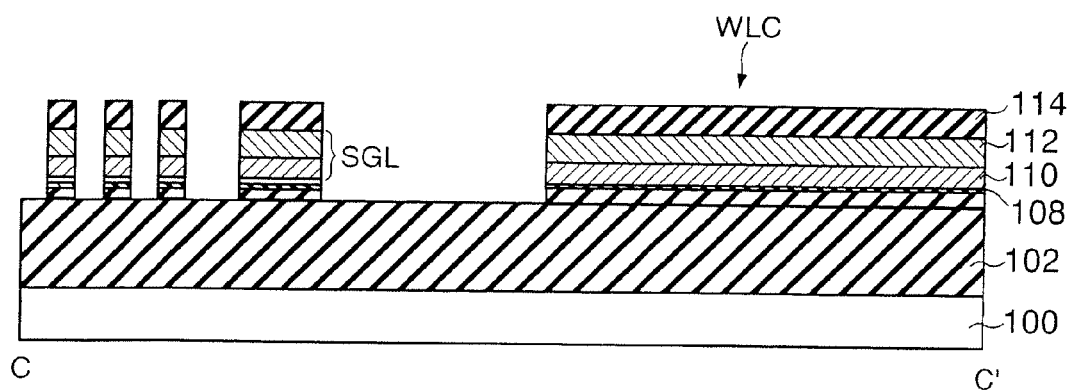
FIG. 4 is a sectional view taken along the line C-C' of FIG. 1 showing the structure of the nonvolatile semiconductor memory device according to the first embodiment.
Figure 5:
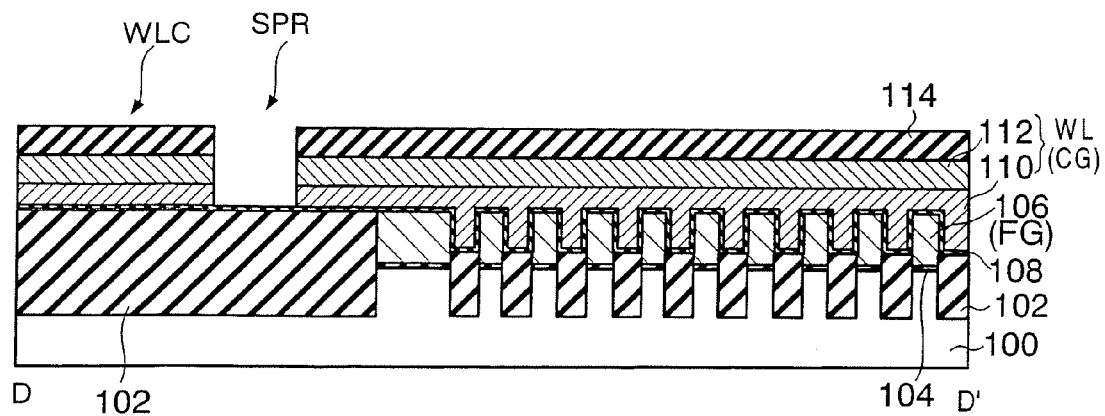
FIG. 5 is a sectional view taken along the line D-D' of FIG. 1 showing the structure of the nonvolatile semiconductor memory device according to the first embodiment.
Figure 6:
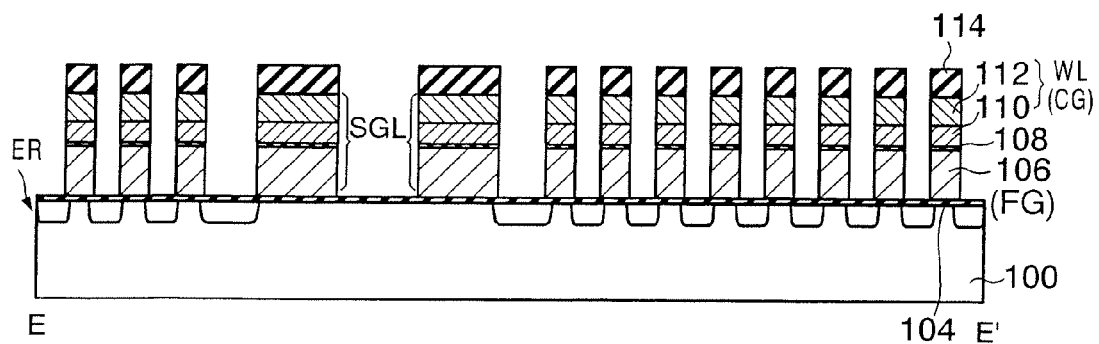
FIG. 6 is a sectional view taken along the line E-E' of FIG. 1 showing the structure of the nonvolatile semiconductor memory device according to the first embodiment.
Figure 7:
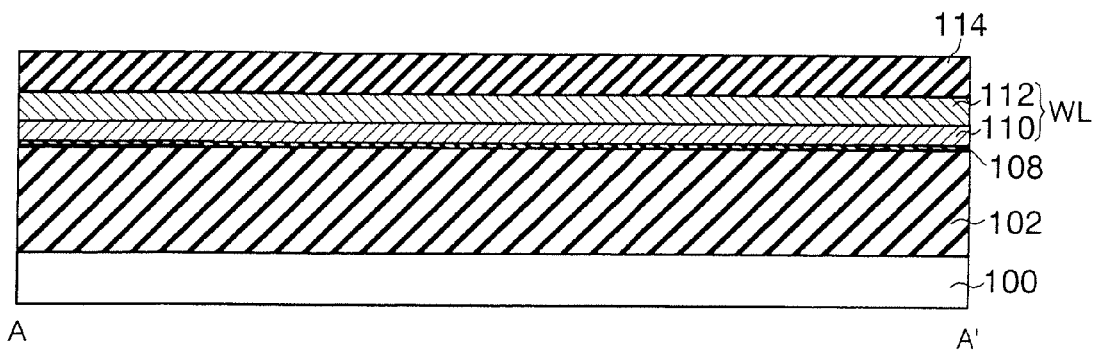
FIG. 7 is a process sectional view for explaining a manufacturing process of the nonvolatile semiconductor memory device according to the first embodiment.
Figure 8:
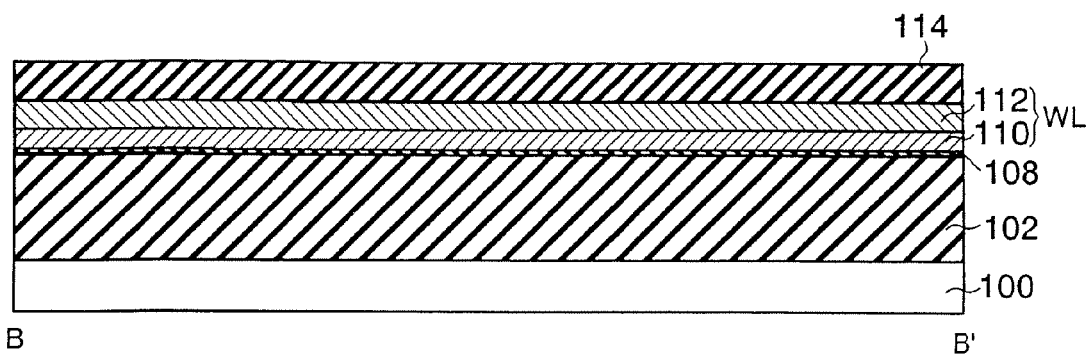
FIG. 8 is a process sectional view for explaining the manufacturing process of the nonvolatile semiconductor memory device according to the first embodiment.
Figure 9:
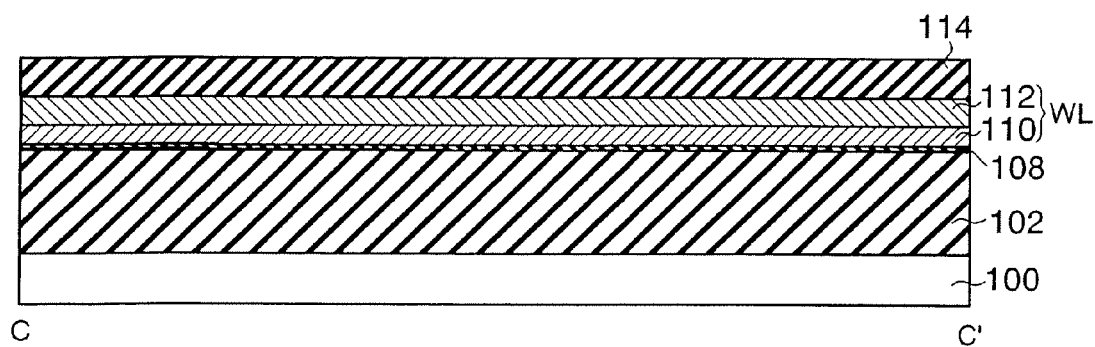
FIG. 9 is a process sectional view for explaining the manufacturing process of the nonvolatile semiconductor memory device according to the first embodiment.
Figure 10:
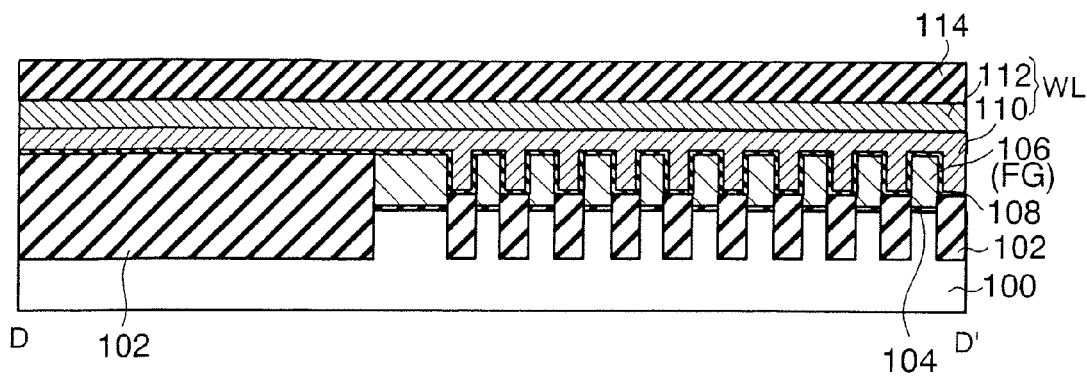
FIG. 10 is a process sectional view for explaining the manufacturing process of the nonvolatile semiconductor memory device according to the first embodiment.
Figure 11:
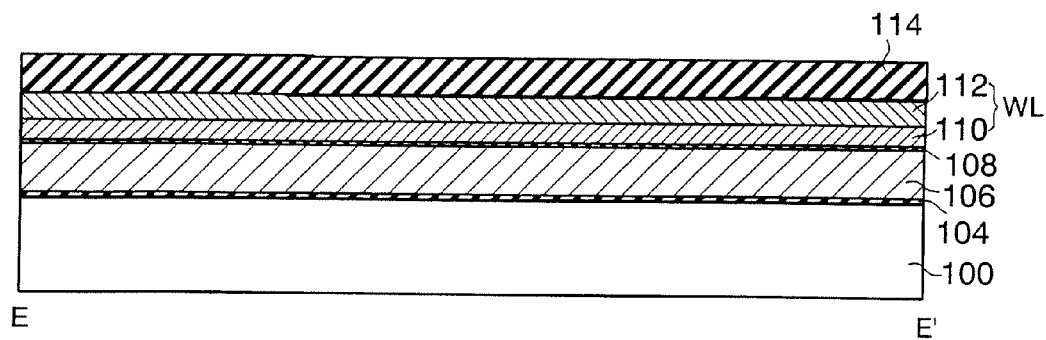
FIG. 11 is a process sectional view for explaining the manufacturing process of the nonvolatile semiconductor memory device according to the first embodiment.
Figure 12:
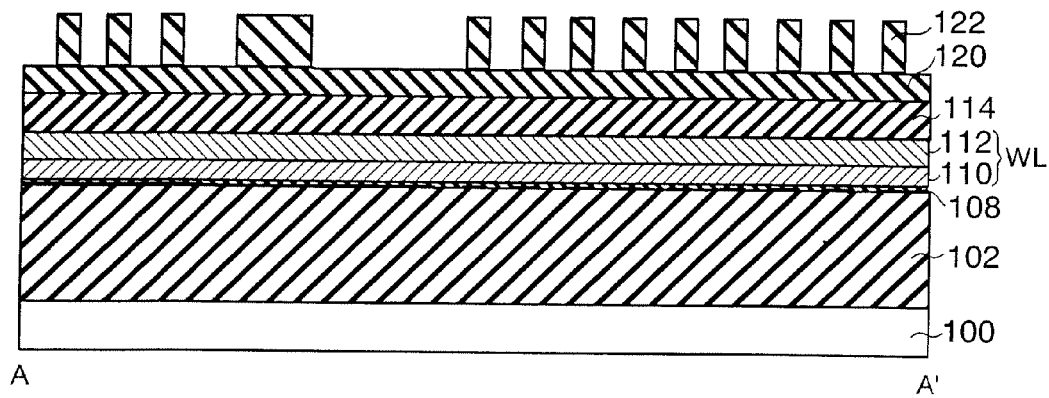
FIG. 12 is a process sectional view for explaining the manufacturing process of the nonvolatile semiconductor memory device according to the first embodiment.
Figure 13:
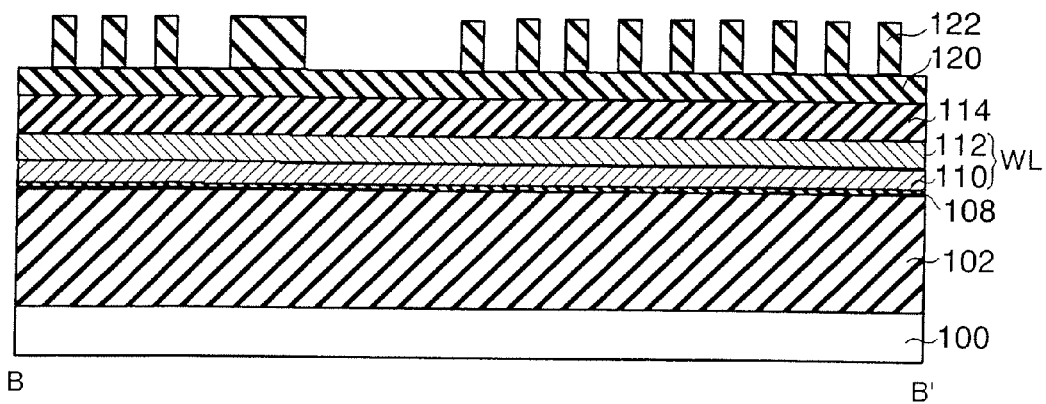
FIG. 13 is a process sectional view for explaining the manufacturing process of the nonvolatile semiconductor memory device according to the first embodiment.
Figure 14:
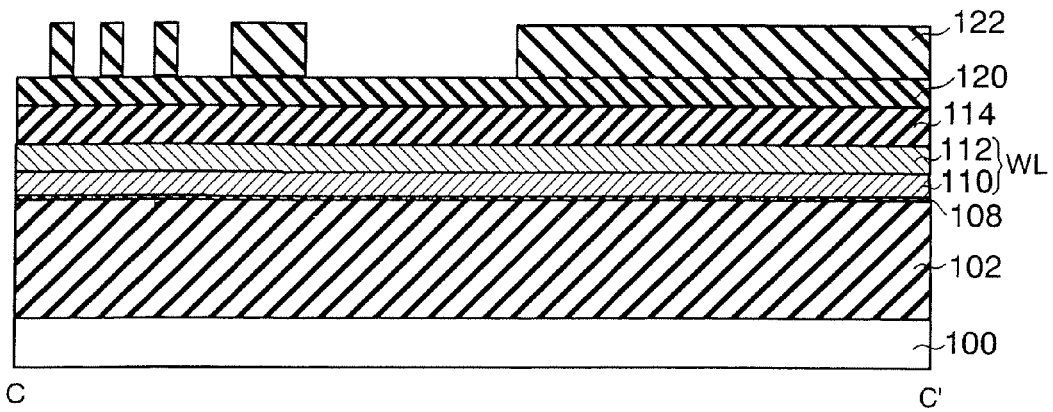
FIG. 14 is a process sectional view for explaining the manufacturing process of the nonvolatile semiconductor memory device according to the first embodiment.
Figure 15:
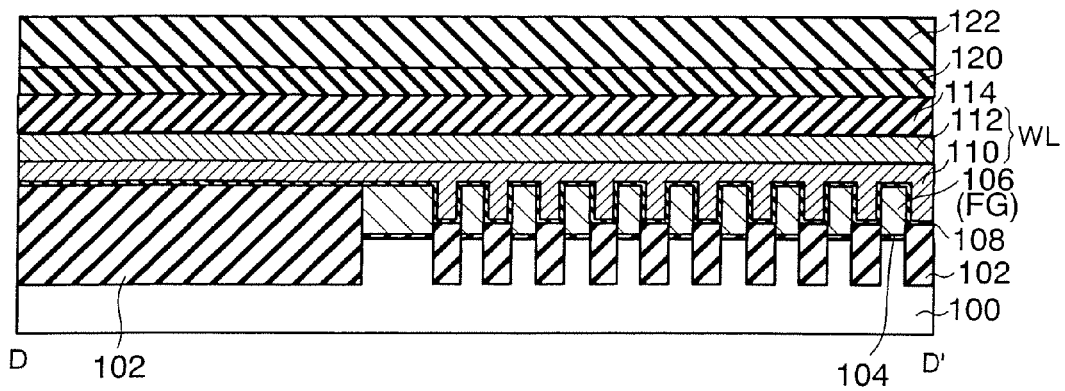
FIG. 15 is a process sectional view for explaining the manufacturing process of the nonvolatile semiconductor memory device according to the first embodiment.
Figure 16:
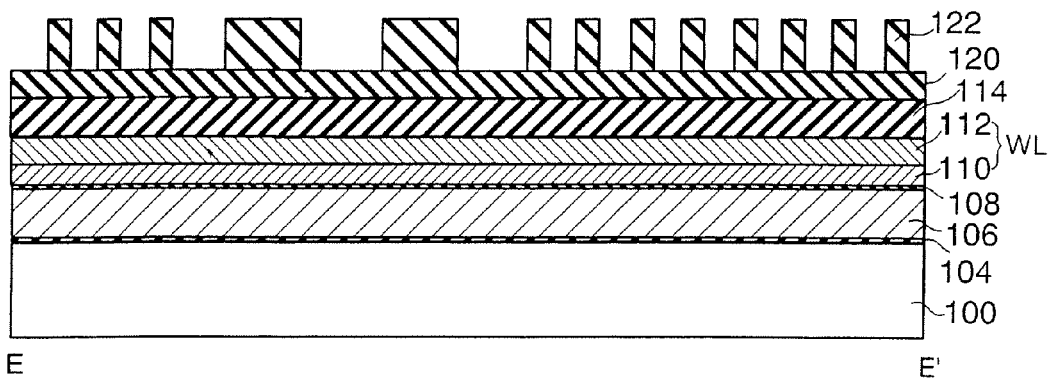
FIG. 16 is a process sectional view for explaining the manufacturing process of the nonvolatile semiconductor memory device according to the first embodiment.
Figure 17:
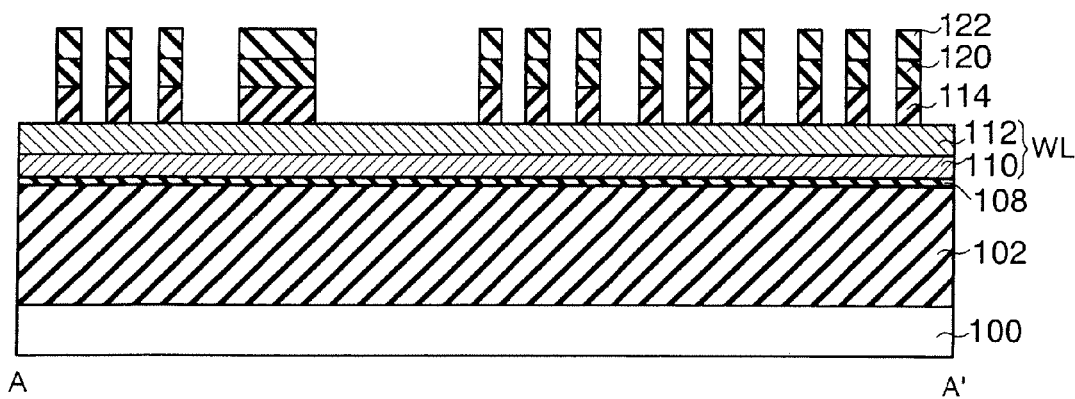
FIG. 17 is a process sectional view for explaining the manufacturing process of the nonvolatile semiconductor memory device according to the first embodiment.
Figure 18:
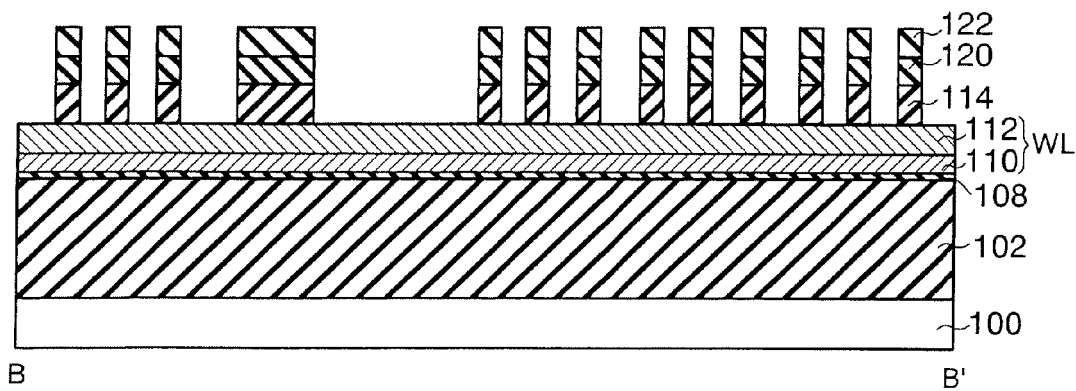
FIG. 18 is a process sectional view for explaining the manufacturing process of the nonvolatile semiconductor memory device according to the first embodiment.
Figure 19:
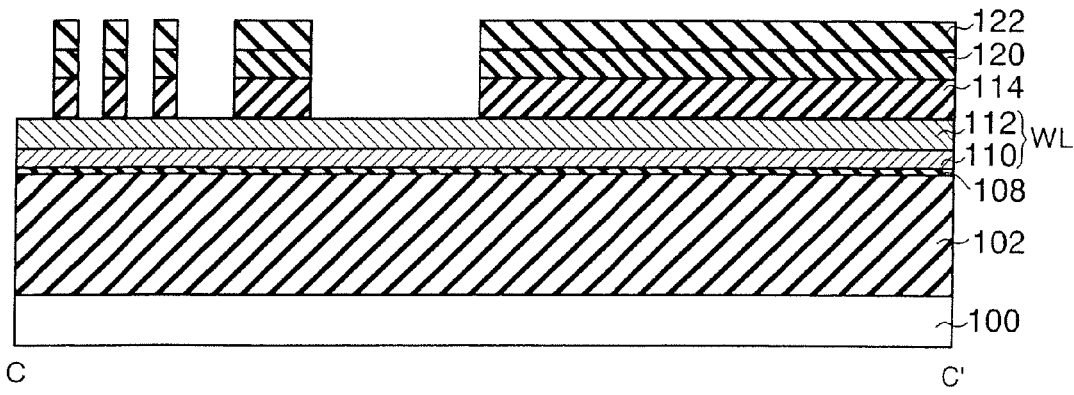
FIG. 19 is a process sectional view for explaining the manufacturing process of the nonvolatile semiconductor memory device according to the first embodiment.
Figure 20:
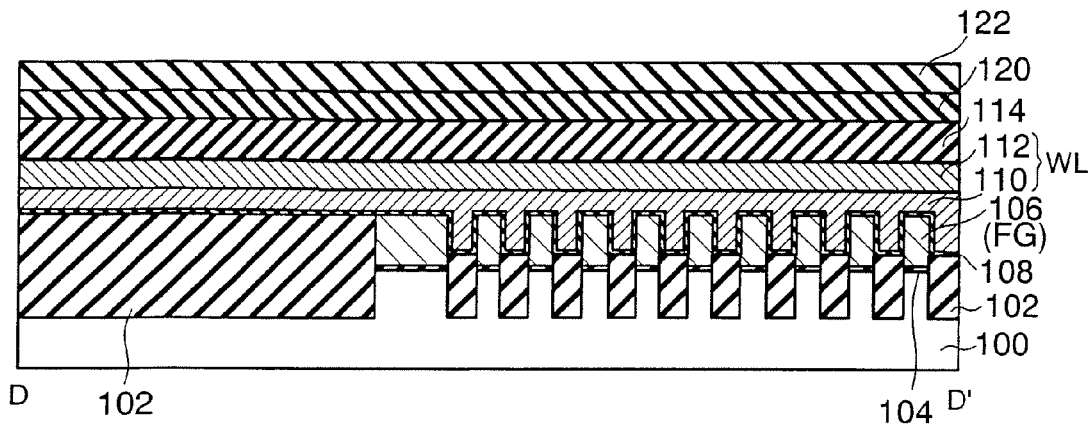
FIG. 20 is a process sectional view for explaining the manufacturing process of the nonvolatile semiconductor memory device according to the first embodiment.
Figure 21:
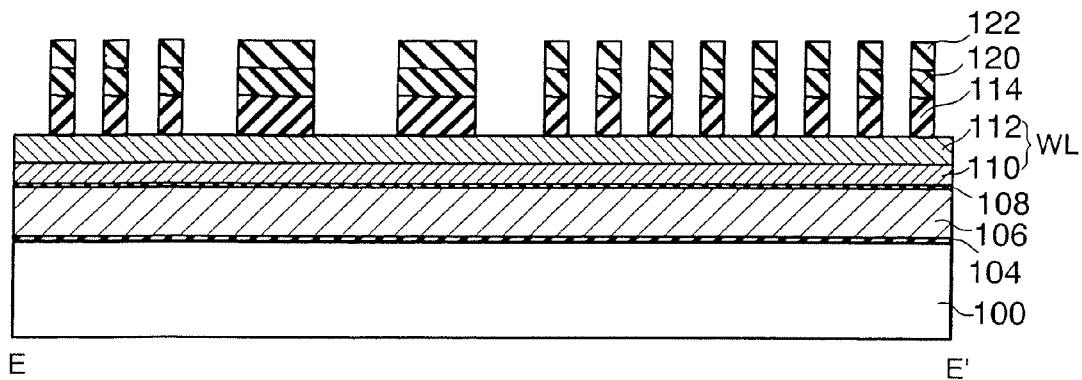
FIG. 21 is a process sectional view for explaining the manufacturing process of the nonvolatile semiconductor memory device according to the first embodiment.
Figure 22:
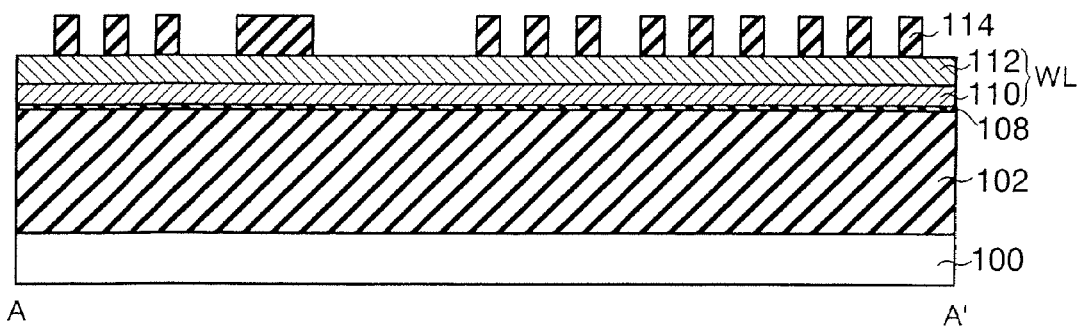
FIG. 22 is a process sectional view for explaining the manufacturing process of the nonvolatile semiconductor memory device according to the first embodiment.
Figure 23:
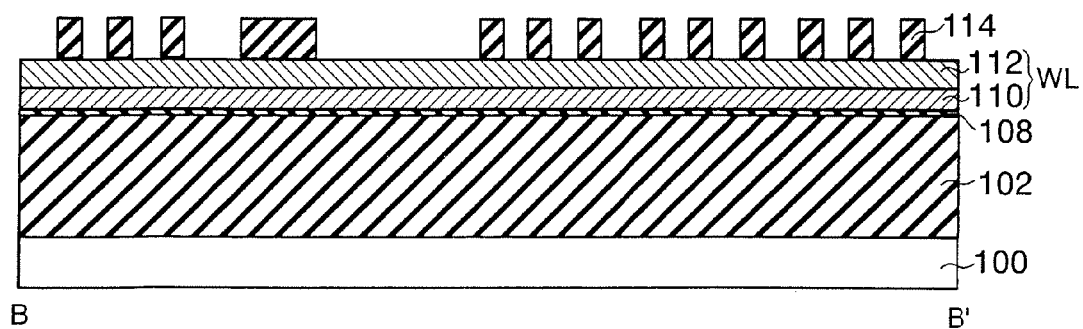
FIG. 23 is a process sectional view for explaining the manufacturing process of the nonvolatile semiconductor memory device according to the first embodiment.
Figure 24:
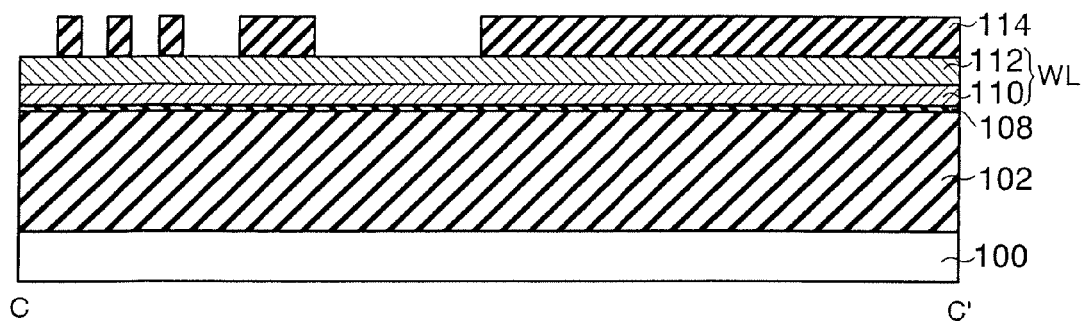
FIG. 24 is a process sectional view for explaining the manufacturing process of the nonvolatile semiconductor memory device according to the first embodiment.
Figure 25:
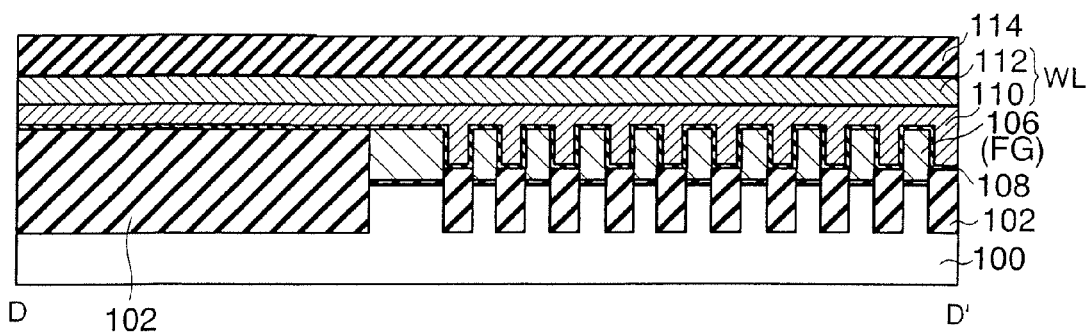
FIG. 25 is a process sectional view for explaining the manufacturing process of the nonvolatile semiconductor memory device according to the first embodiment.
Figure 26:
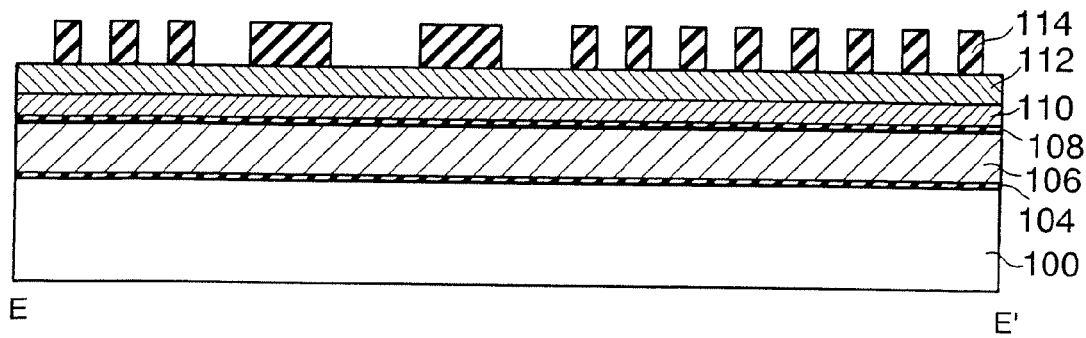
FIG. 26 is a process sectional view for explaining the manufacturing process of the nonvolatile semiconductor memory device according to the first embodiment.
Figure 27:
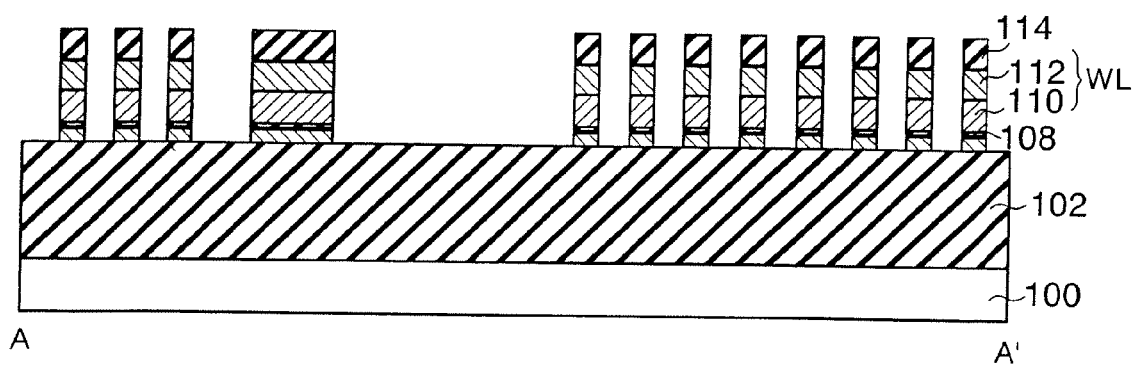
FIG. 27 is a process sectional view for explaining the manufacturing process of the nonvolatile semiconductor memory device according to the first embodiment.
Figure 28:
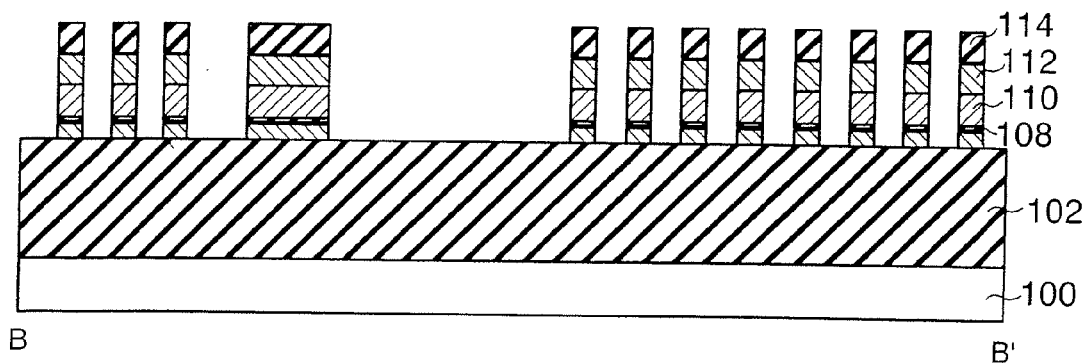
FIG. 28 is a process sectional view for explaining the manufacturing process of the nonvolatile semiconductor memory device according to the first embodiment.
Figure 29:
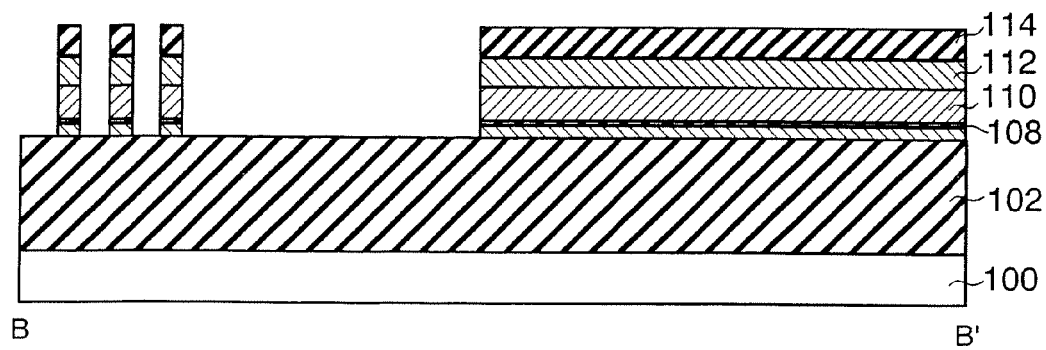
FIG. 29 is a process sectional view for explaining the manufacturing process of the nonvolatile semiconductor memory device according to the first embodiment.
Figure 30:
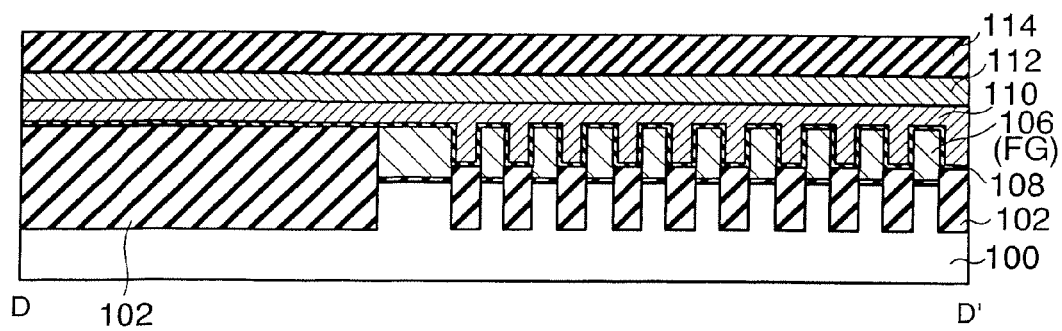
FIG. 30 is a process sectional view for explaining the manufacturing process of the nonvolatile semiconductor memory device according to the first embodiment.
Figure 31:
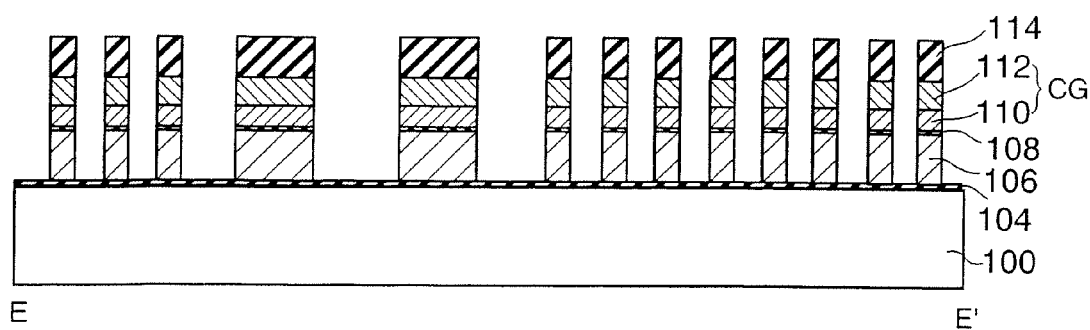
FIG. 31 is a process sectional view for explaining the manufacturing process of the nonvolatile semiconductor memory device according to the first embodiment.
Figure 32:
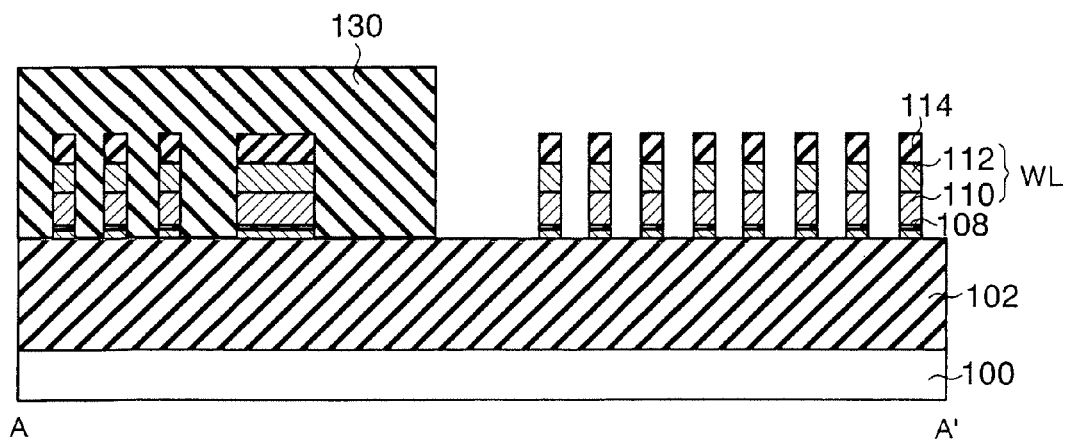
FIG. 32 is a process sectional view for explaining the manufacturing process of the nonvolatile semiconductor memory device according to the first embodiment.
Figure 33:
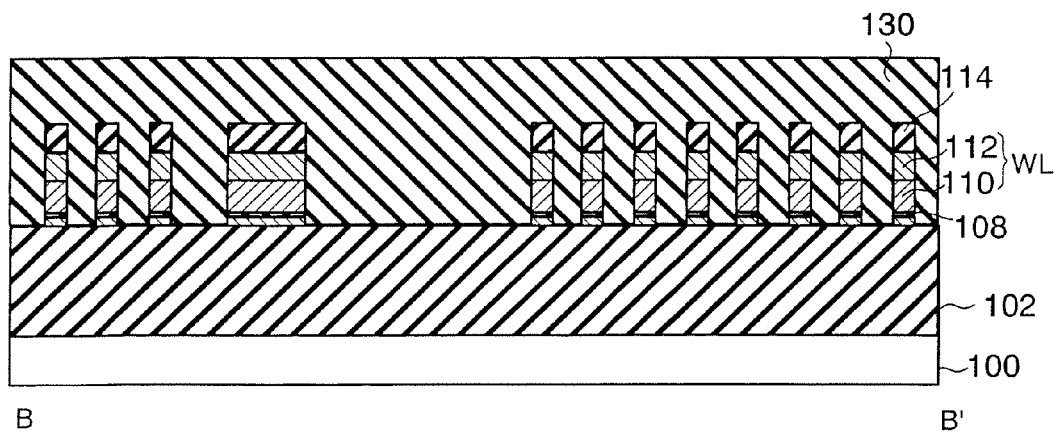
FIG. 33 is a process sectional view for explaining the manufacturing process of the nonvolatile semiconductor memory device according to the first embodiment.
Figure 34:
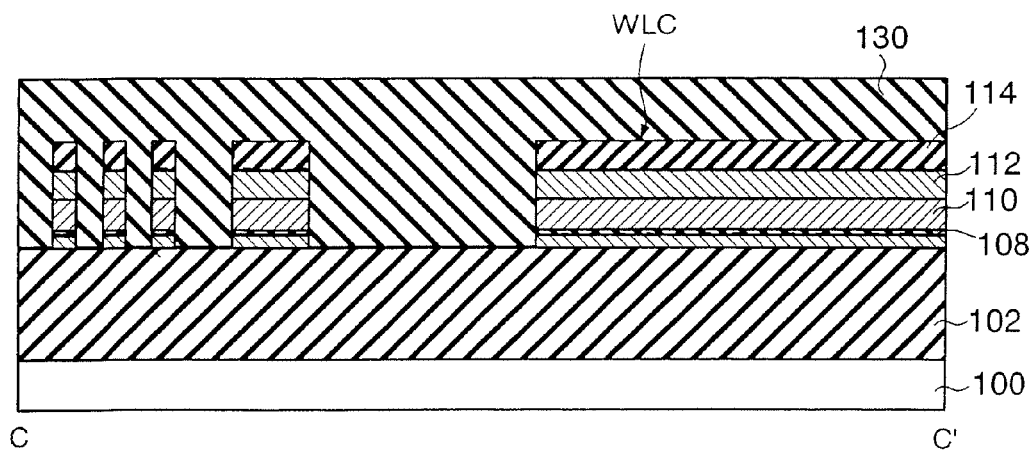
FIG. 34 is a process sectional view for explaining the manufacturing process of the nonvolatile semiconductor memory device according to the first embodiment.
Figure 35:
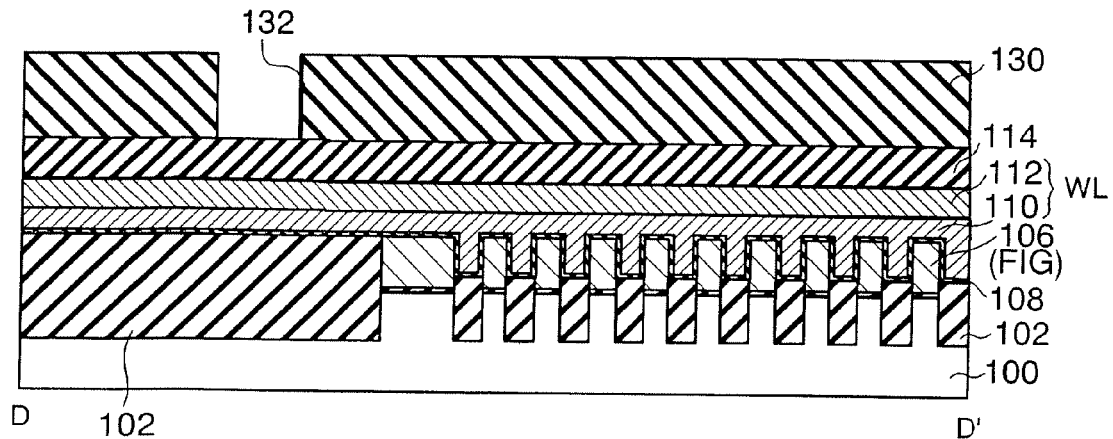
FIG. 35 is a process sectional view for explaining the manufacturing process of the nonvolatile semiconductor memory device according to the first embodiment.
Figure 36:
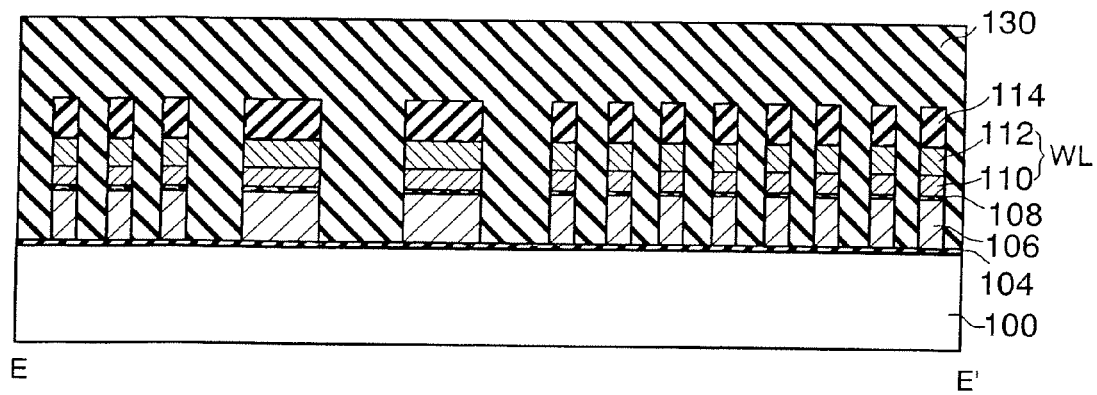
FIG. 36 is a process sectional view for explaining the manufacturing process of the nonvolatile semiconductor memory device according to the first embodiment.
Figure 37:
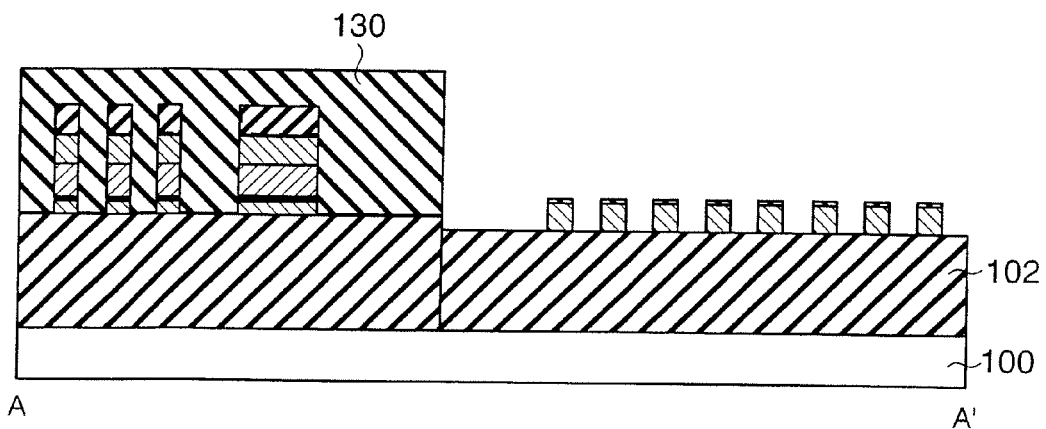
FIG. 37 is a process sectional view for explaining the manufacturing process of the nonvolatile semiconductor memory device according to the first embodiment.
Figure 38:
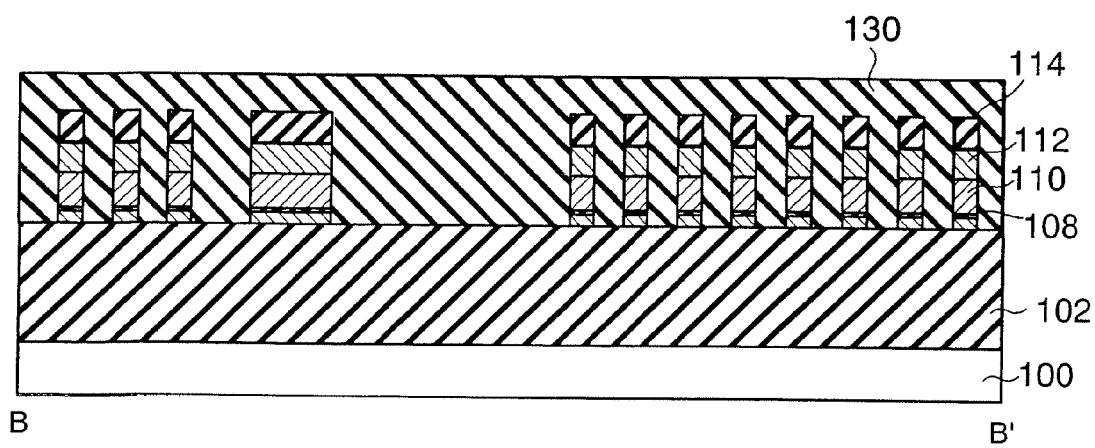
FIG. 38 is a process sectional view for explaining the manufacturing process of the nonvolatile semiconductor memory device according to the first embodiment.
Figure 39:
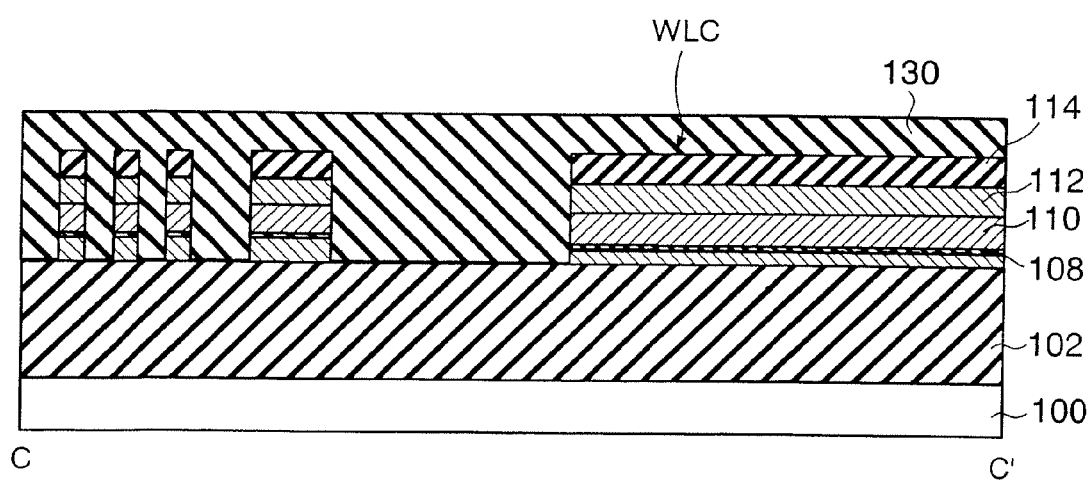
FIG. 39 is a process sectional view for explaining the manufacturing process of the nonvolatile semiconductor memory device according to the first embodiment.
Figure 40:
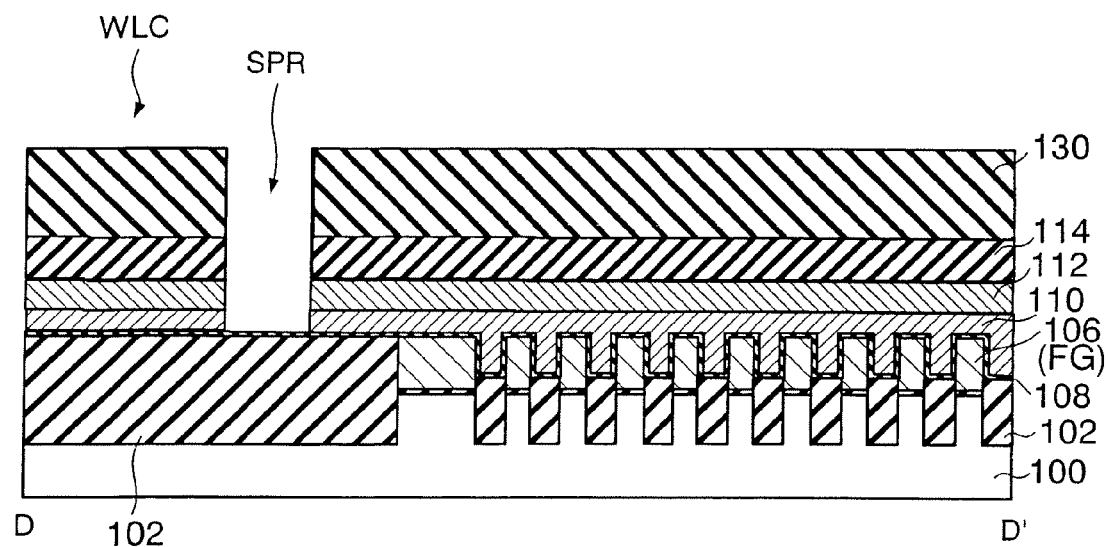
FIG. 40 is a process sectional view for explaining the manufacturing process of the nonvolatile semiconductor memory device according to the first embodiment.
Figure 41:
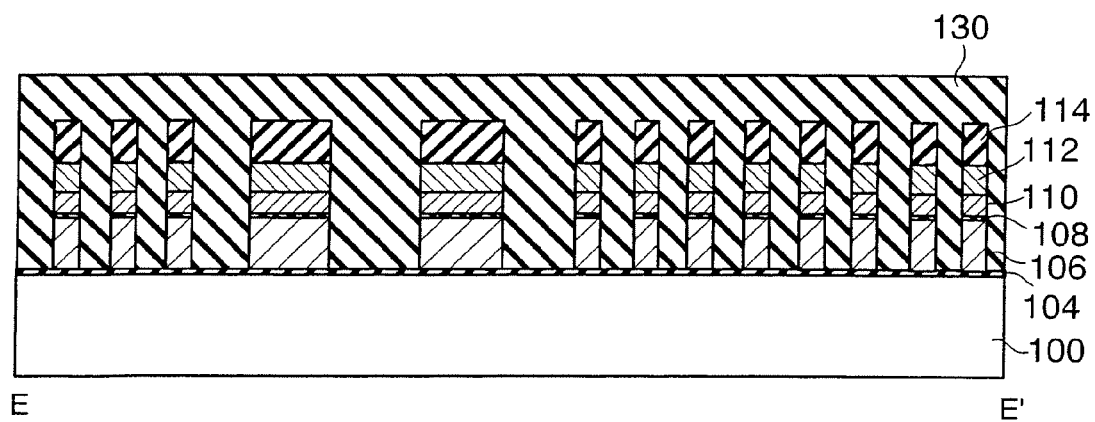
FIG. 41 is a process sectional view for explaining the manufacturing process of the nonvolatile semiconductor memory device according to the first embodiment.

First, the structure of a NAND-type nonvolatile semiconductor memory device according to this embodiment will be explained based on FIG. 1 to FIG. 6. FIG. 1 is a plan view of the nonvolatile semiconductor memory device according to this embodiment, and FIG. 2 to FIG. 6 are a sectional view taken along the line A-A', a sectional view taken along the line B-B', a sectional view taken along the line C-C', a sectional view taken along the line D-D', and a sectional view taken along the line E-E', respectively, of FIG. 1.

As can been seen from these figures, in the nonvolatile semiconductor memory device according to this embodiment, plural word lines WL are provided in parallel in a first direction. Beneath these word lines, plural memory cell regions ER are formed. Select gate lines SGL are provided in parallel with the word lines WL.

On one end side of the word lines WL, a word line connecting portion WLC is formed. The word line connecting portion WLC is formed to intentionally connect tip portions of the word lines WL.

A separation pattern region SPR is formed between this word line connecting portion WLC and the word lines WL. This separation pattern region SPR is formed to electrically separate the word line connection portion WLC and the word lines WL. After the word lines WL and the word line connecting portion WLC are formed, the separation pattern region SPR is formed by removing the word lines WL situated in the separation pattern region SPR.

Incidentally, the word lines WL correspond to plural linear patterns in this embodiment, and the word line connecting portion WLC corresponds to a connecting portion in this embodiment.

Other respects than those described above are the same as in the structure of a normal nonvolatile semiconductor memory device, and hence a detailed explanation thereof is omitted.

Next, a manufacturing process of the nonvolatile semiconductor memory device according to this embodiment will be explained based on FIG. 7 to FIG. 41. FIG. 7, FIG. 12, FIG. 17, FIG. 22, FIG. 27, FIG. 32, and FIG. 37 are sectional views taken along the line A-A' of FIG. 1 for explaining the manufacturing process, FIG. 8, FIG. 13, FIG. 18, FIG. 23, FIG. 28, FIG. 33, and FIG. 38 are sectional views taken along the line B-B' of FIG. 1 for explaining the manufacturing process, FIG. 9, FIG. 14, FIG. 19, FIG. 24, FIG. 29, FIG. 34, and FIG. 39 are sectional views taken along the line C-C' of FIG. 1 for explaining the manufacturing process, FIG. 10, FIG. 15, FIG. 20, FIG. 25, FIG. 30, FIG. 35, and FIG. 40 are sectional views taken along the line D-D' of FIG. 1 for explaining the manufacturing process, and FIG. 11, FIG. 16, FIG. 21, FIG. 26, FIG. 31, FIG. 36, and FIG. 41 are sectional views taken along the line E-E' of FIG. 1 for explaining the manufacturing process.

First, as shown in FIG. 7 to FIG. 11, an element separation insulating film 102 is formed by STI (Shallow Trench Isolation) on the surface side of a semiconductor substrate 100. Subsequently, a tunnel insulating film 104 is formed by a silicon oxide film or the like in a memory cell region where memory cells are formed. Thereafter, a polycrystalline silicon film 106 which becomes floating gates later is formed on the tunnel insulating film 104. Then, an ONO film 108 which becomes an interpoly insulating film is formed on the polycrystalline silicon film 106. Subsequently, a polycrystalline silicon film 110 and a tungsten silicide film 112 which become control gates later are formed on the ONO film 108. Subsequently, a silicon nitride film 114 which is used as a mask material is formed on the tungsten silicide film 112.

Next, as shown in FIG. 12 to FIG. 16, an antireflection film 120, for example, with a thickness of approximately 10 nm is formed on the silicon nitride film 114. Subsequently, a photoresist 122, for example, with a thickness of approximately 200 nm is formed on the antireflection film 120. Then, the photoresist 122 is patterned as desired by lithography technology. In this embodiment, the wiring width and space width of the pattern are approximately 90 nm.

In this embodiment, by patterning the photoresist 122 as just described, plural parallel patterns of word lines WL and a pattern of the word line connecting portion WLC which is provided on one end side of the word lines WL and connects the word lines WL are formed.

Then, as shown in FIG. 17 to FIG. 21, the antireflection film 120 and the silicon nitride film 114 are etched by RIE technology with the photoresist 122 as a mask.

Subsequently, as shown in FIG. 22 to FIG. 26, the antireflection film 120 and the photoresist 122 are removed using ashing technology.

Thereafter, as shown in FIG. 27 to FIG. 31, the tungsten silicide film 112, the polycrystalline silicon film 110, the ONO film 108, the polycrystalline silicon film 106 are etched with the silicon nitride film 114 as a mask to obtain a desired gate pattern. Namely, control gates CG which become word lines WL are formed by the tungsten silicide film 112 and the polycrystalline silicon film 110, and floating gates FG are formed by the polycrystalline silicon film 106. In particular, as can be seen from FIG. 30, on one end side of the word line WL, the word line connection portion WLC is formed, and plural word lines WL are connected to each other. This word line connecting portion WLC is also formed by the tungsten silicide film 112 and the polycrystalline silicon film 110. Accordingly, the tungsten silicide film 112 and the polycrystalline silicon film 110 correspond to a first member to be patterned which is formed by a conductive member.

Next, as shown in FIG. 32 to FIG. 36, after a photoresist 130, for example, with a thickness of 1000 nm is formed, this photoresist 130 is patterned as desired by the lithography technology. More specifically, particularly as can be seen from FIG. 35, an opening 132 is formed in a portion of the photoresist 130 where a separation pattern region SPR is positioned.

Then, as shown in FIG. 37 to FIG. 41, the silicon nitride film 114, the tungsten silicide film 112, and the polycrystalline silicon film 110 are etched by the RIE technology with the photoresist 130 as a mask. As a result, the separation pattern region SPR is formed, and thereby the word line connecting portion WLC is electrically separated from the word lines WL. Thereafter, the photoresist 130 is removed using the ashing technology. Consequently, the nonvolatile semiconductor memory device shown in FIG. 2 to FIG. 6 is obtained.

As described above, according to the nonvolatile semiconductor memory device of this embodiment, by providing the word line connecting portion WLC on one end side of the word lines WL, it becomes possible that when the word lines WL are formed by etching with the silicon nitride film 114 as a mask, a portion such as a tip of the word line WL where resist pattern collapse tends to occur does not exist. Accordingly, a margin for patterning improves, which makes it possible to provide the stable high-yield nonvolatile semiconductor memory device.

Second Embodiment

In the second embodiment, by forming a memory cell region connecting portion which connects respective memory cell regions in end portions of a memory cell array and element separation regions, the occurrence of resist pattern collapse when the memory cell regions are formed is prevented. Further details will be given below.

Figure 42:
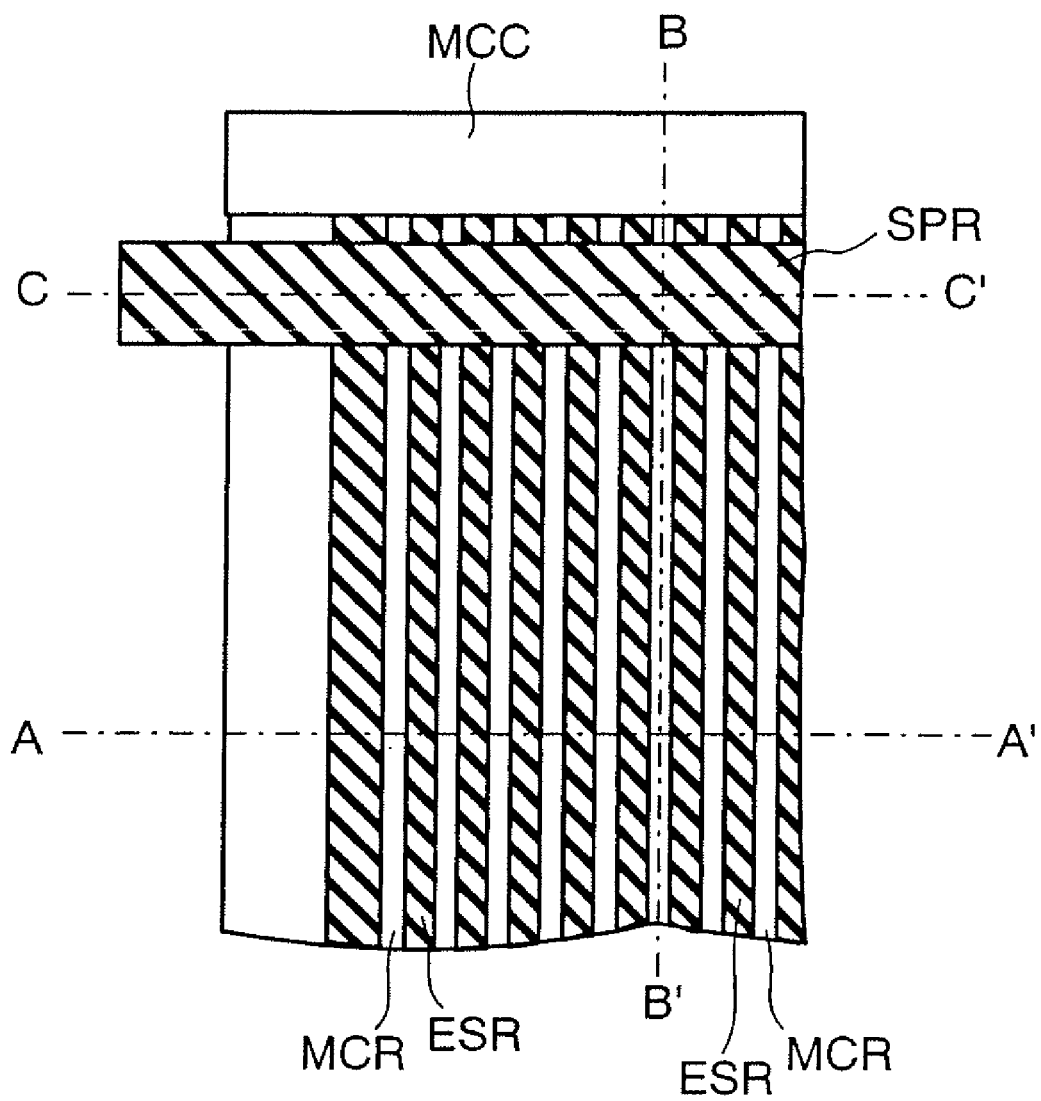
FIG. 42 is a plan view showing the structure of a nonvolatile semiconductor memory device according to a second embodiment.
Figure 43:
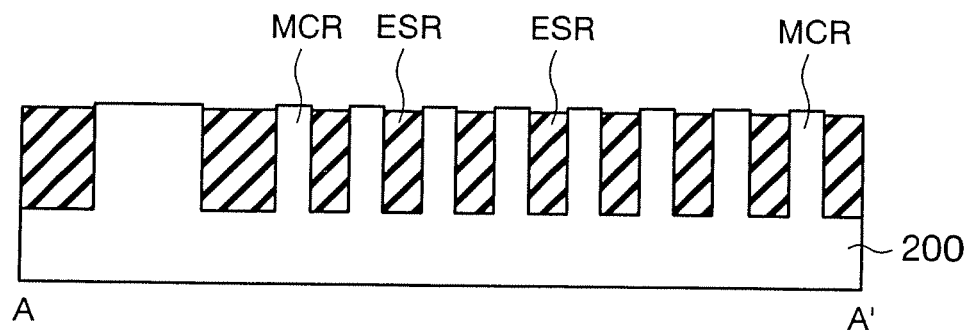
FIG. 43 is a sectional view taken along the line A-A' of FIG. 42 showing the structure of the nonvolatile semiconductor memory device according to the second embodiment.
Figure 44:
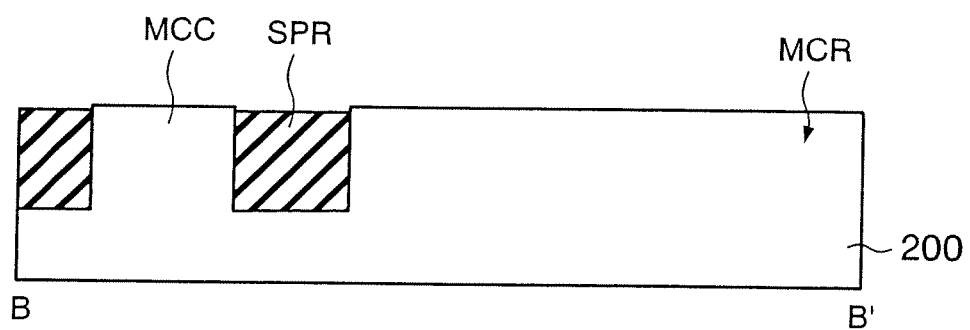
FIG. 44 is a sectional view taken along the line B-B' of FIG. 42 showing the structure of the nonvolatile semiconductor memory device according to the second embodiment.
Figure 45:
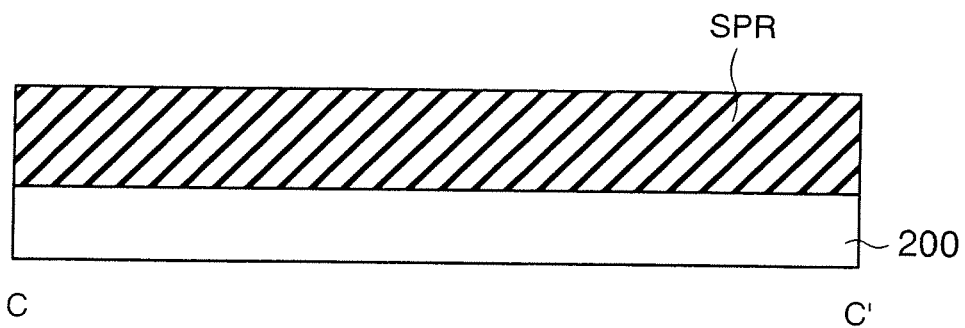
FIG. 45 is a sectional view taken along the line C-C' of FIG. 42 showing the structure of the nonvolatile semiconductor memory device according to the second embodiment.

First, the structure of a NAND-type nonvolatile semiconductor memory device according to this embodiment will be explained based on FIG. 42 to FIG. 45. FIG. 42 is a plan view of the nonvolatile semiconductor memory device according to this embodiment, and FIG. 43 to FIG. 45 are a sectional view taken along the line A-A', a sectional view taken along the line B-B', and a sectional view taken along the line C-C', respectively, of FIG. 42.

As can been seen from these figures, in the nonvolatile semiconductor memory device according to this embodiment, plural memory cell regions MCR are formed in parallel along a second direction which is a direction crossing word lines. In other words, the memory cell regions MCR and element separation regions ESR are formed alternately in a striped pattern along the second direction.

On one end side of the memory cell regions MCR, a memory cell region connecting portion MCC which connects respective memory cell regions MCR is formed. This memory cell region connecting portion MCC is formed to prevent the occurrence of resist collapse when a mask to form trenches for the element separation regions ESR in a semiconductor substrate 200 is patterned with a photoresist.

Moreover, the separation pattern region SPR which electrically separates these memory cell region connecting portion MCC and memory cell regions MCR is formed between the memory cell region connecting portion MCC and the memory cell regions MCR. Other respects than those described above are the same as in the structure of the normal nonvolatile semiconductor memory device, and hence a detailed explanation thereof is omitted.

Incidentally, the memory cell regions MCR correspond to plural linear patterns in this embodiment, and the memory cell region connecting portion MCC corresponds to a connecting portion which connects the plural linear patterns in this embodiment.

Next, a manufacturing process of the nonvolatile semiconductor memory device according to this embodiment will be explained based on FIG. 46 to FIG. 78. FIG. 46, FIG. 49, FIG. 52, FIG. 55, FIG. 58, FIG. 61, FIG. 64, FIG. 67, FIG. 70, FIG. 73, and FIG. 76 are sectional views taken along the line A-A' of FIG. 42 for explaining the manufacturing process, FIG. 47, FIG. 50, FIG. 53, FIG. 56, FIG. 59, FIG. 62, FIG. 65, FIG. 68, FIG. 71, FIG. 74, and FIG. 77 are sectional views taken along the line B-B' of FIG. 42 for explaining the manufacturing process, and FIG. 48, FIG. 51, FIG. 54, FIG. 57, FIG. 60, FIG. 63, FIG. 66, FIG. 69, FIG. 72, FIG. 75 and FIG. 78 are sectional views taken along the line C-C' of FIG. 42 for explaining the manufacturing process.

Figure 46:
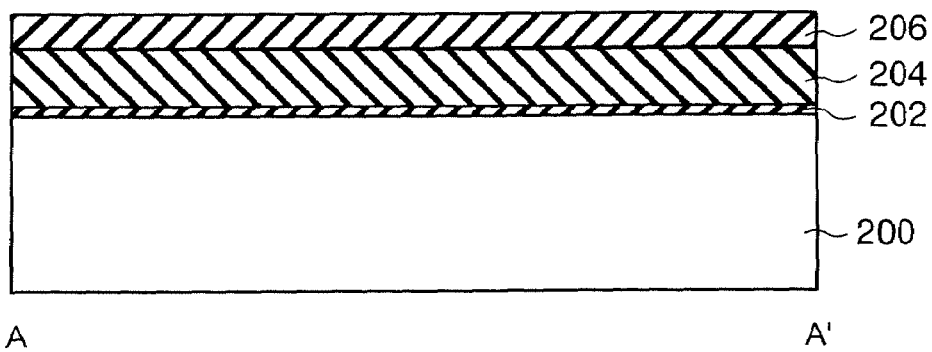
FIG. 46 is a process sectional view for explaining a manufacturing process of the nonvolatile semiconductor memory device according to the second embodiment.
Figure 47:
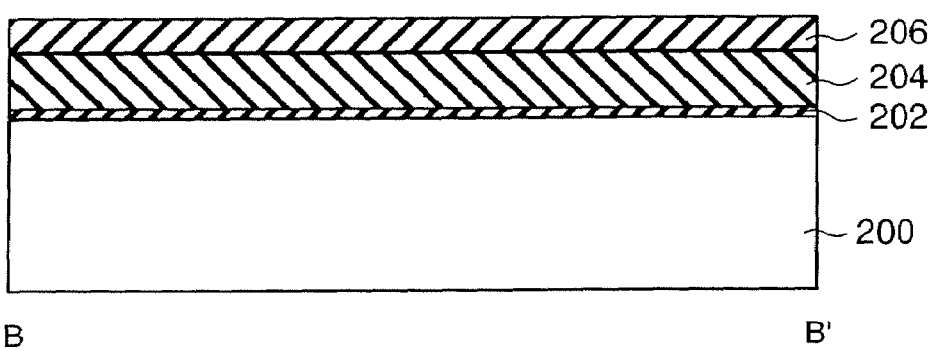
FIG. 47 is a process sectional view for explaining the manufacturing process of the nonvolatile semiconductor memory device according to the second embodiment.
Figure 48:
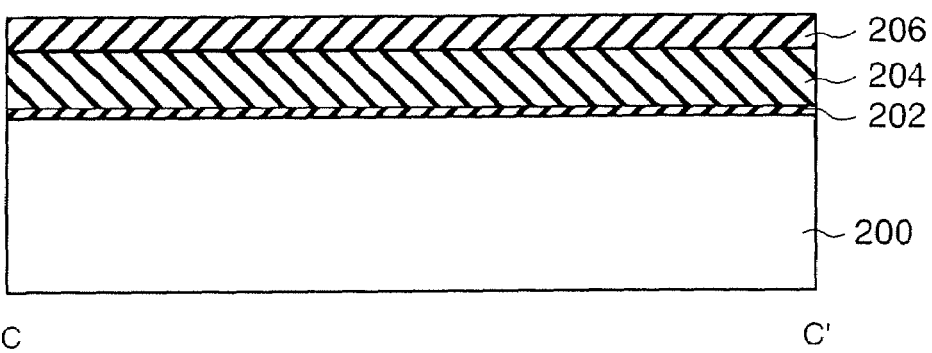
FIG. 48 is a process sectional view for explaining the manufacturing process of the nonvolatile semiconductor memory device according to the second embodiment.

First, as shown in FIG. 46 to FIG. 48, on the surface side of a semiconductor substrate 200, a silicon oxide film 202 is formed, and a silicon nitride film 204 is formed on the silicon oxide film 202. Subsequently, a silicon oxide film 206 is formed on the silicon nitride film 204. These silicon oxide film 202, silicon nitride film 204, and silicon oxide film 206 serve as a mask member later.

Figure 49:
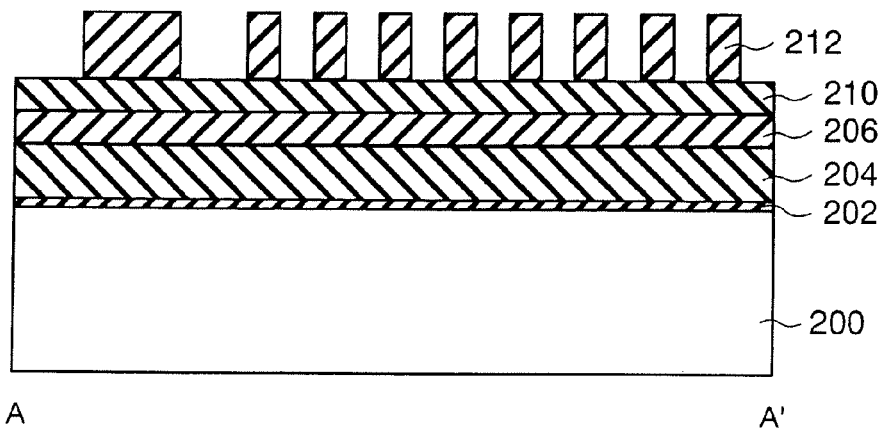
FIG. 49 is a process sectional view for explaining the manufacturing process of the nonvolatile semiconductor memory device according to the second embodiment.
Figure 50:
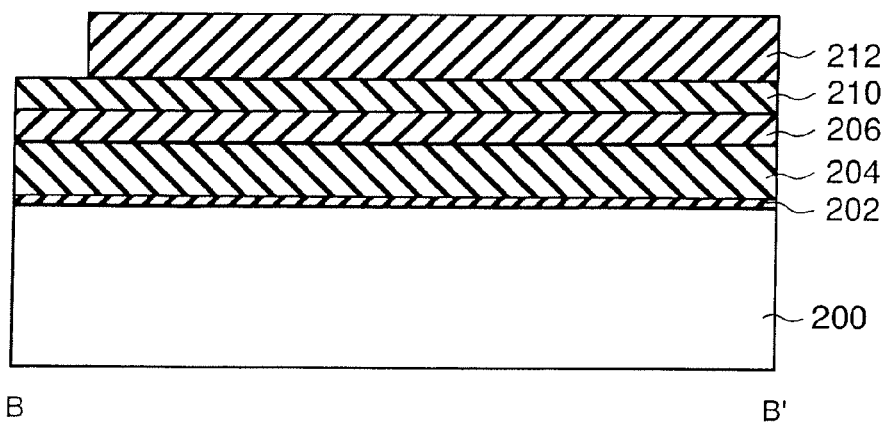
FIG. 50 is a process sectional view for explaining the manufacturing process of the nonvolatile semiconductor memory device according to the second embodiment.
Figure 51:
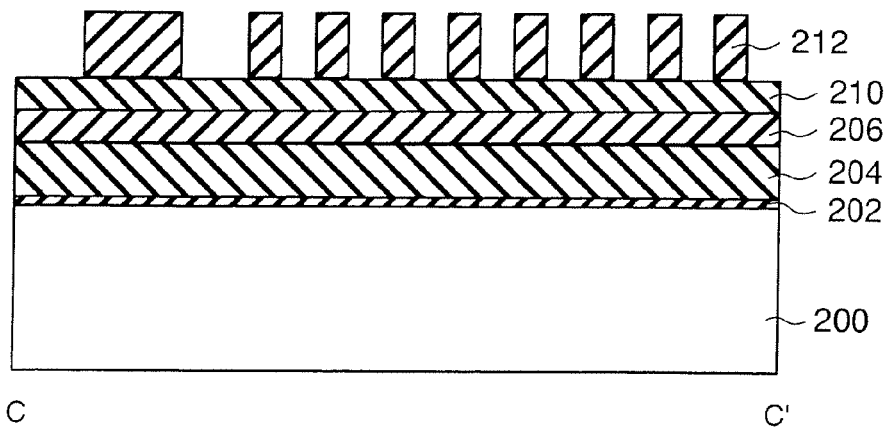
FIG. 51 is a process sectional view for explaining the manufacturing process of the nonvolatile semiconductor memory device according to the second embodiment.

Next, as shown in FIG. 49 to FIG. 51, an antireflection film 210, for example, with a thickness of 10 nm is formed on the silicon oxide film 206, and a photoresist 212, for example, with a thickness of 200 nm is formed on the antireflection film 210. Subsequently, the photoresist 212 is patterned as desired by the lithography technology. In this embodiment, the wiring width and space width of the pattern are approximately 90 nm.

By this patterning, linear patterns to form the element separation regions ESR and the memory cell regions MCR and a pattern to form the memory cell region connecting portion MCC are formed in the photoresist 212.

Figure 52:
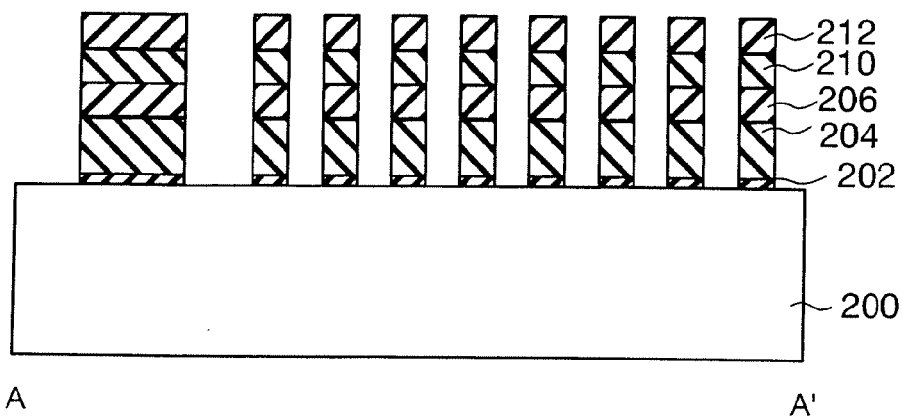
FIG. 52 is a process sectional view for explaining the manufacturing process of the nonvolatile semiconductor memory device according to the second embodiment.
Figure 53:
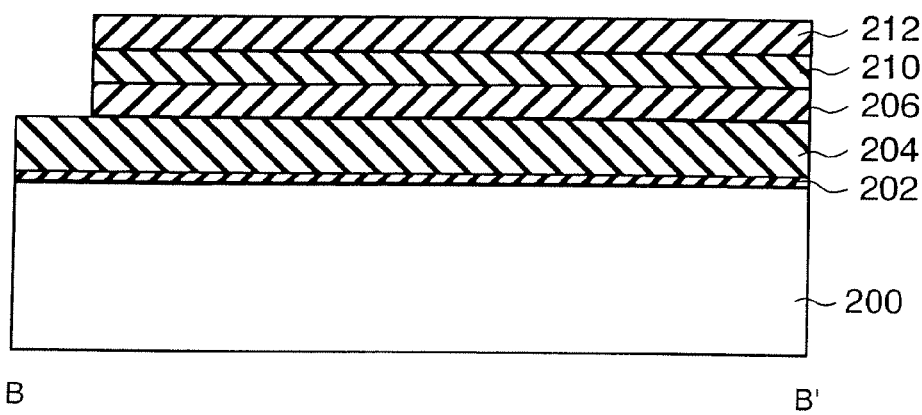
FIG. 53 is a process sectional view for explaining the manufacturing process of the nonvolatile semiconductor memory device according to the second embodiment.
Figure 54:
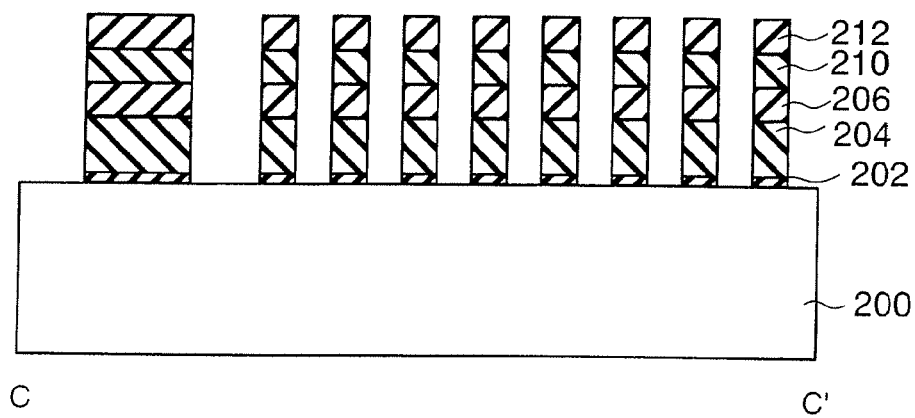
FIG. 54 is a process sectional view for explaining the manufacturing process of the nonvolatile semiconductor memory device according to the second embodiment.

Then, as shown in FIG. 52 to FIG. 54, the antireflection film 210, the silicon oxide film 206, the silicon nitride film 204, and the silicon oxide film 202 are etched by the RIE technology with the photoresist 212 as a mask.

Figure 55:
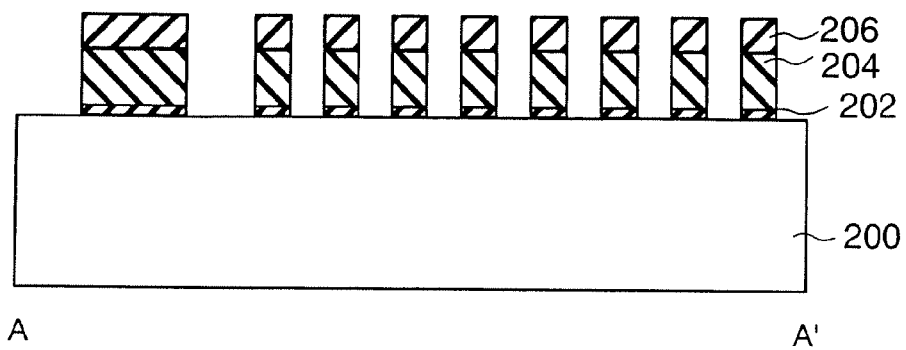
FIG. 55 is a process sectional view for explaining the manufacturing process of the nonvolatile semiconductor memory device according to the second embodiment.
Figure 56:
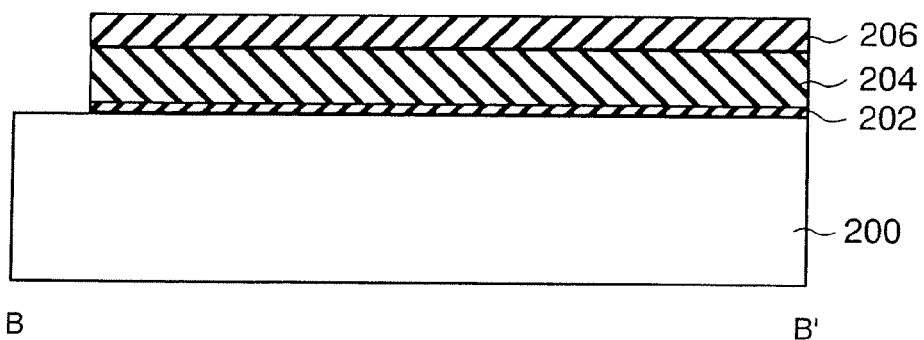
FIG. 56 is a process sectional view for explaining the manufacturing process of the nonvolatile semiconductor memory device according to the second embodiment.
Figure 57:
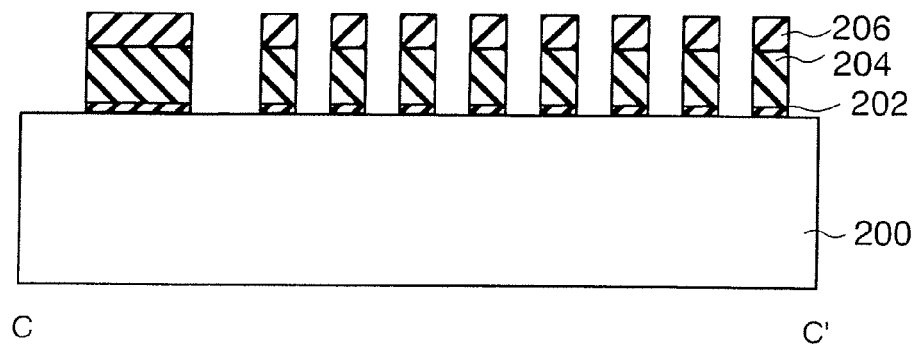
FIG. 57 is a process sectional view for explaining the manufacturing process of the nonvolatile semiconductor memory device according to the second embodiment.

Subsequently, as shown in FIG. 55 to FIG. 57, the antireflection film 210 and the photoresist 212 are removed using the ashing technology.

Figure 58:
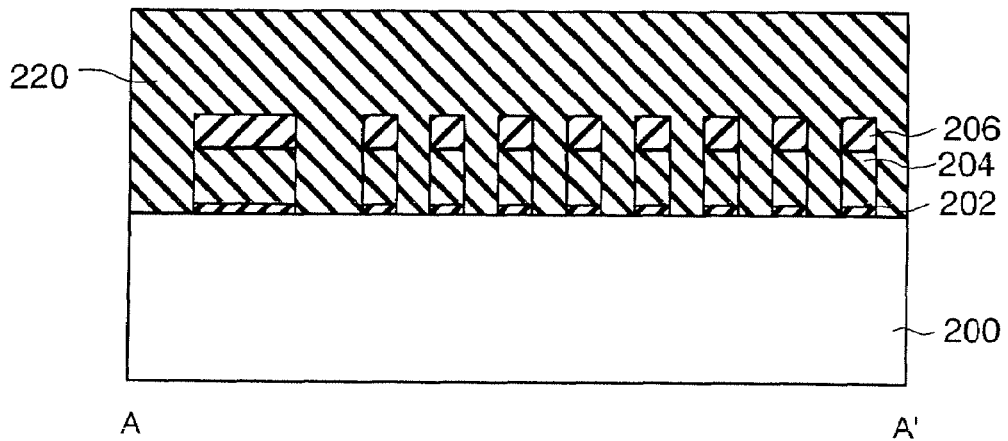
FIG. 58 is a process sectional view for explaining the manufacturing process of the nonvolatile semiconductor memory device according to the second embodiment.
Figure 59:
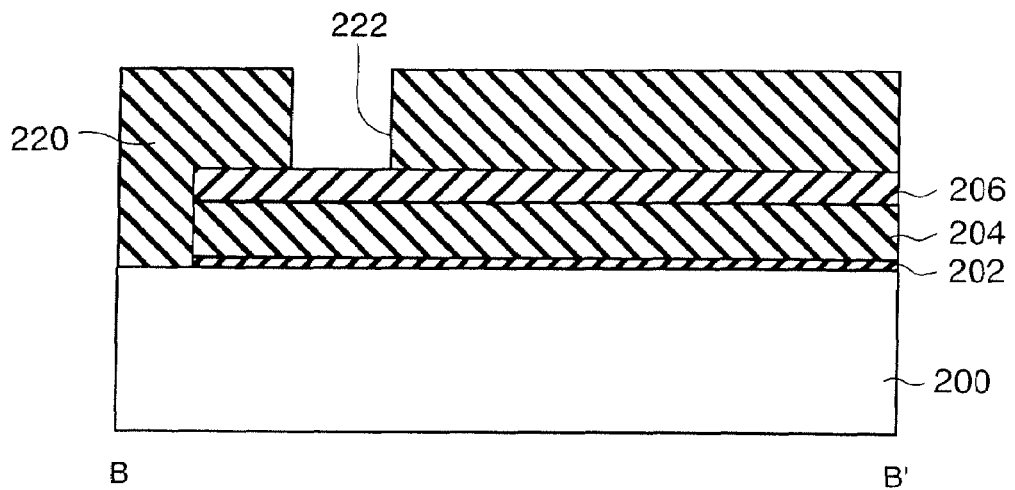
FIG. 59 is a process sectional view for explaining the manufacturing process of the nonvolatile semiconductor memory device according to the second embodiment.
Figure 60:
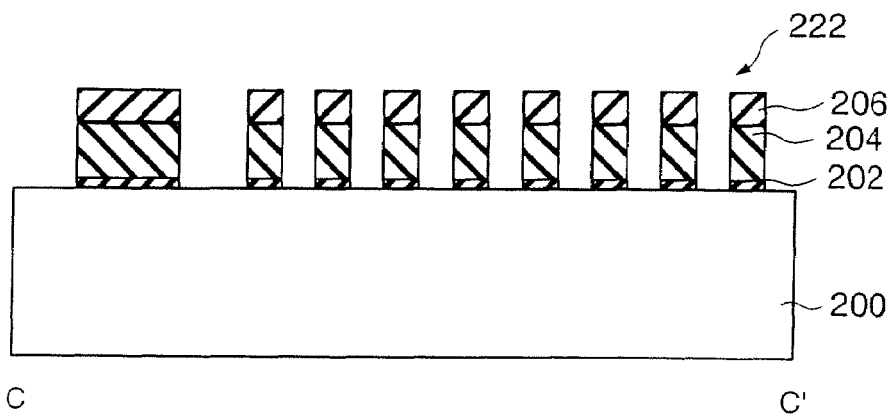
FIG. 60 is a process sectional view for explaining the manufacturing process of the nonvolatile semiconductor memory device according to the second embodiment.

Thereafter, as shown in FIG. 58 to FIG. 60, after a photoresist 220 is formed on this nonvolatile semiconductor memory device, the photoresist 220 is patterned as desired by the lithography technology. Thereby, an opening 222 is formed in a region corresponding to the separation pattern region SPR in the photoresist 220.

Figure 61:
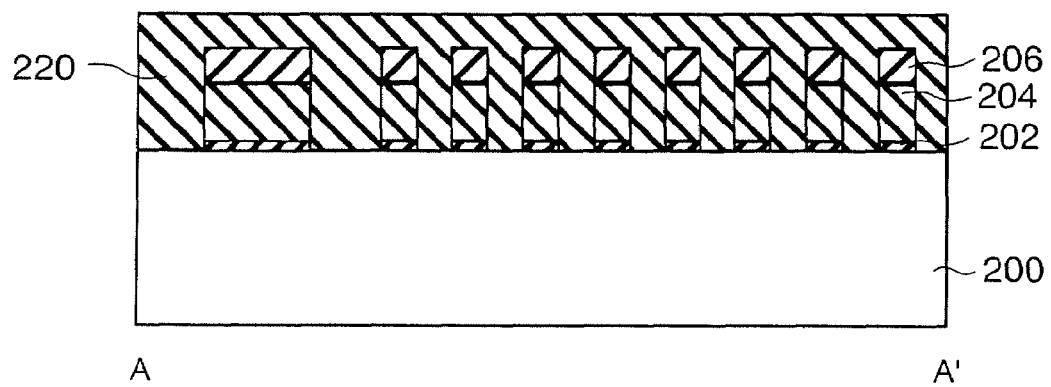
FIG. 61 is a process sectional view for explaining the manufacturing process of the nonvolatile semiconductor memory device according to the second embodiment.
Figure 62:
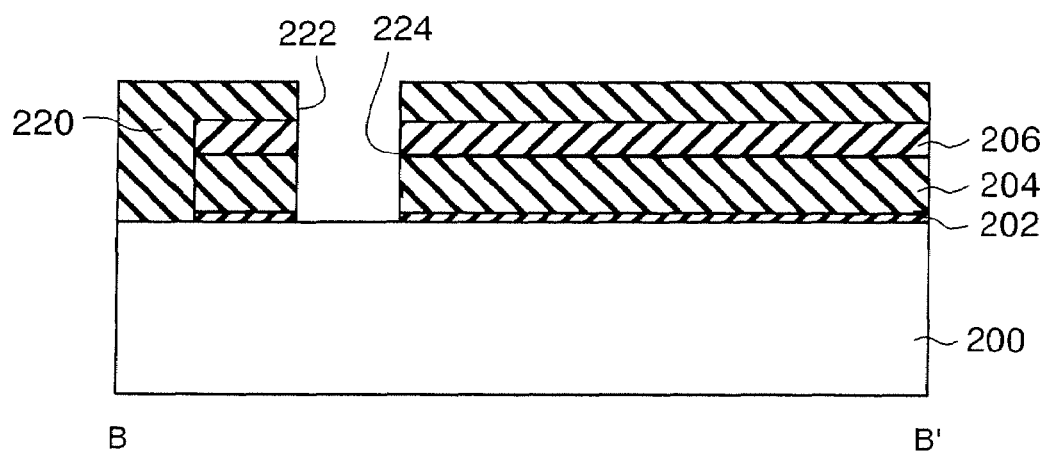
FIG. 62 is a process sectional view for explaining the manufacturing process of the nonvolatile semiconductor memory device according to the second embodiment.
Figure 63:
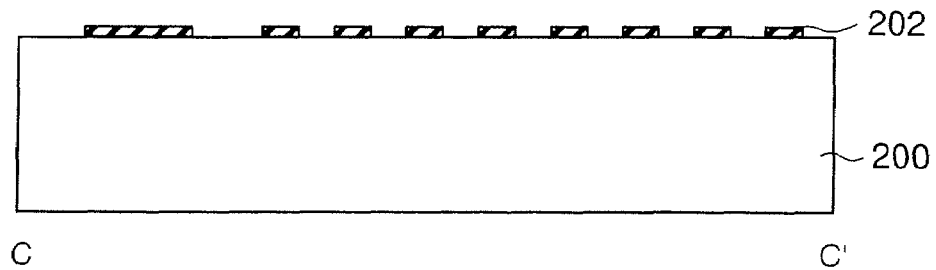
FIG. 63 is a process sectional view for explaining the manufacturing process of the nonvolatile semiconductor memory device according to the second embodiment.

Next, as shown in FIG. 61 to FIG. 63, the silicon oxide film 206, the silicon nitride film 204, and the silicon oxide film 202 are etched using the RIE technology with the photoresist 220 as a mask to thereby form an opening 224 to form the separation pattern region SPR which electrically separates the memory cell regions MCR and the memory cell region connecting portion MCC.

Figure 64:
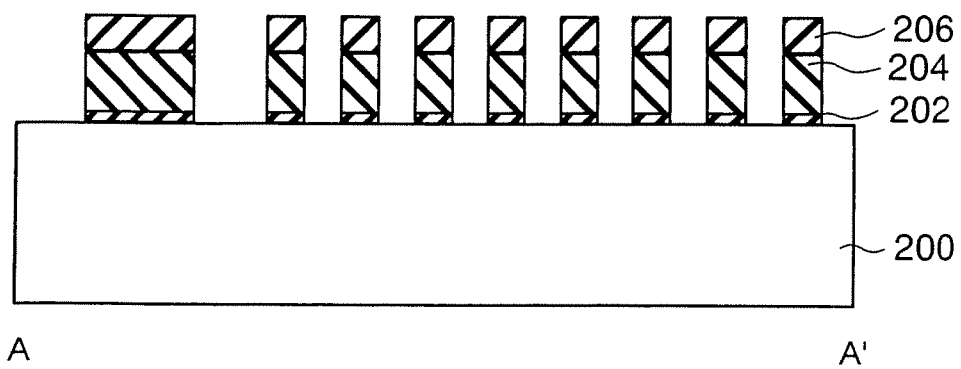
FIG. 64 is a process sectional view for explaining the manufacturing process of the nonvolatile semiconductor memory device according to the second embodiment.
Figure 65:
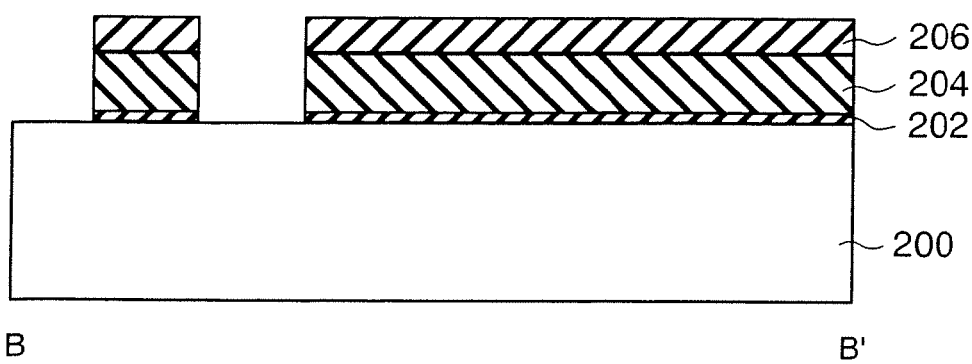
FIG. 65 is a process sectional view for explaining the manufacturing process of the nonvolatile semiconductor memory device according to the second embodiment.
Figure 66:
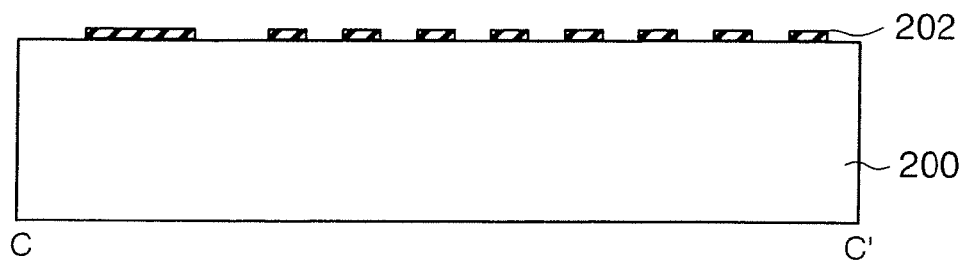
FIG. 66 is a process sectional view for explaining the manufacturing process of the nonvolatile semiconductor memory device according to the second embodiment.

Then, as shown in FIG. 64 to FIG. 66, the photoresist 220 is removed using the ashing technology.

Figure 67:
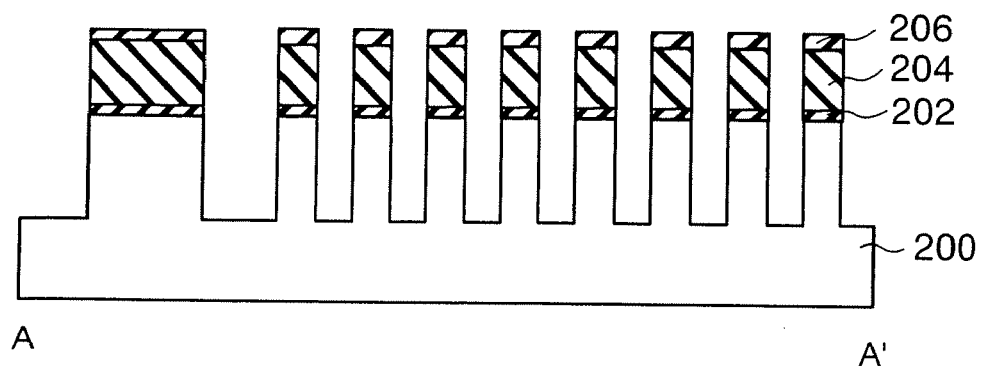
FIG. 67 is a process sectional view for explaining the manufacturing process of the nonvolatile semiconductor memory device according to the second embodiment.
Figure 68:
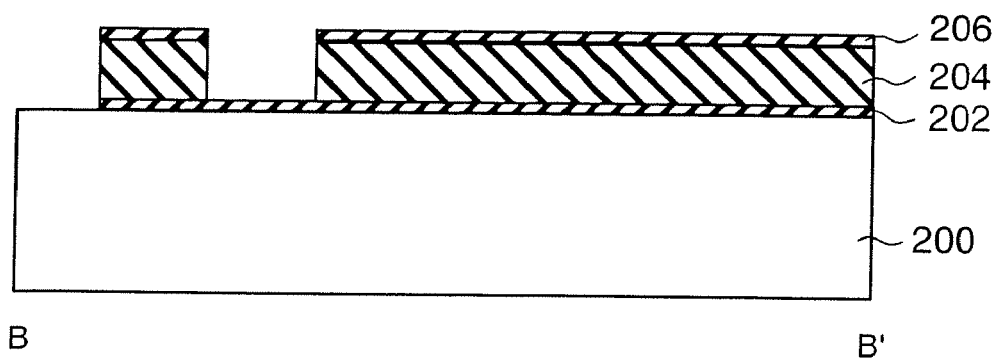
FIG. 68 is a process sectional view for explaining the manufacturing process of the nonvolatile semiconductor memory device according to the second embodiment.
Figure 69:
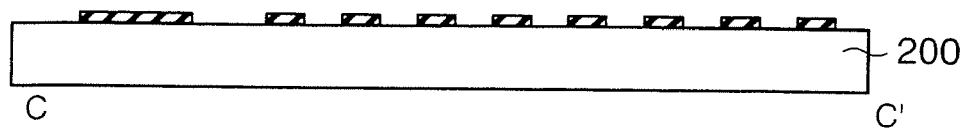
FIG. 69 is a process sectional view for explaining the manufacturing process of the nonvolatile semiconductor memory device according to the second embodiment.

Subsequently, as shown in FIG. 67 to FIG. 69, the semiconductor substrate 200 is etched by the RIE technology with the silicon oxide film 206 as a mask, and thereby trenches which become the element separation regions ESR and a trench which becomes the separation pattern region SPR are formed in the semiconductor substrate 200. Accordingly, the semiconductor substrate 200 corresponds to a second member to be patterned in this embodiment.

Figure 70:
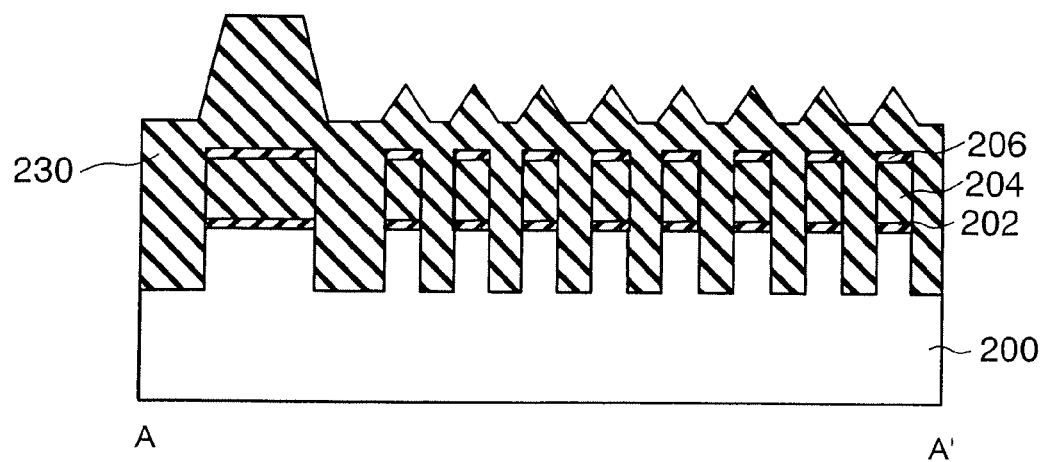
FIG. 70 is a process sectional view for explaining the manufacturing process of the nonvolatile semiconductor memory device according to the second embodiment.
Figure 71:
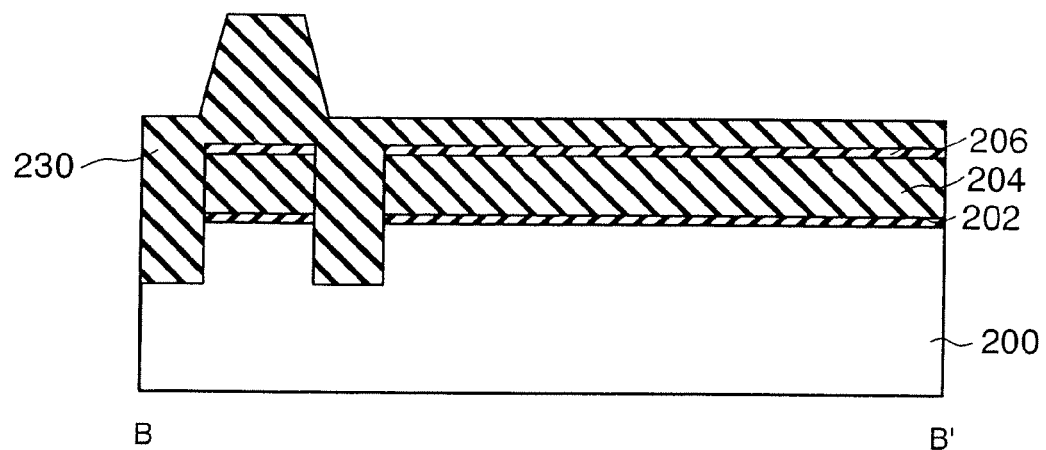
FIG. 71 is a process sectional view for explaining the manufacturing process of the nonvolatile semiconductor memory device according to the second embodiment.
Figure 72:
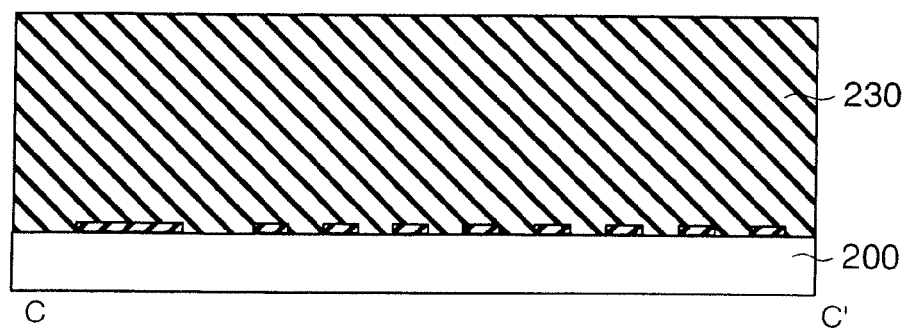
FIG. 72 is a process sectional view for explaining the manufacturing process of the nonvolatile semiconductor memory device according to the second embodiment.

Thereafter, as shown in FIG. 70 to FIG. 72, an element separation insulating film 230 such as a silicon oxide film or the like is formed using HDP technology. Consequently, the element separation insulating film 230 is embedded in the trenches which become the element separation regions ESR and the trench which becomes the separation pattern region SPR.

Figure 73:
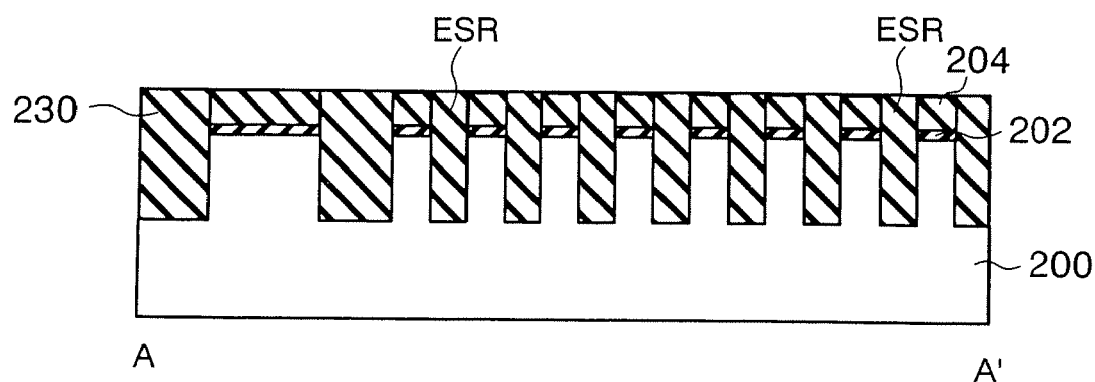
FIG. 73 is a process sectional view for explaining the manufacturing process of the nonvolatile semiconductor memory device according to the second embodiment.
Figure 74:
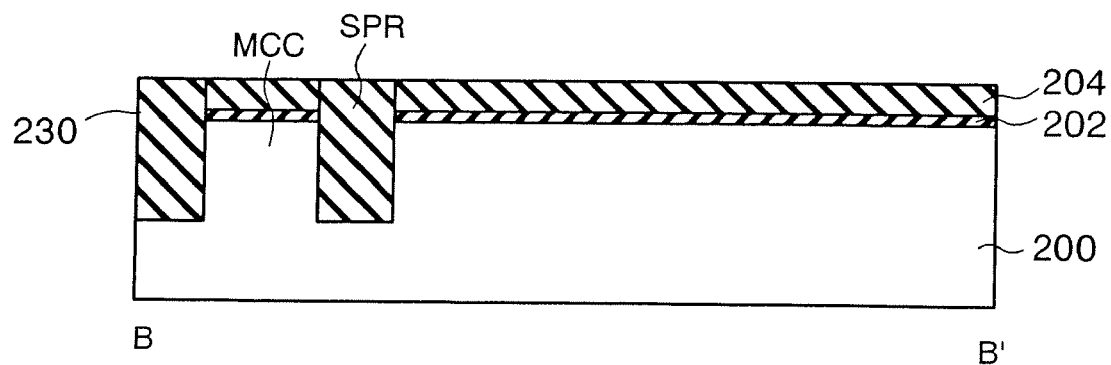
FIG. 74 is a process sectional view for explaining the manufacturing process of the nonvolatile semiconductor memory device according to the second embodiment.
Figure 75:
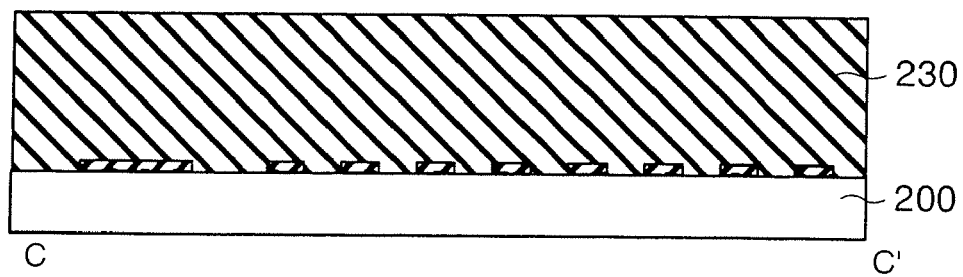
FIG. 75 is a process sectional view for explaining the manufacturing process of the nonvolatile semiconductor memory device according to the second embodiment.

Next, as shown in FIG. 73 to FIG. 75, the element separation insulating film 230 is planarized using CMP technology with the silicon nitride film 204 as a stopper.

Figure 76:
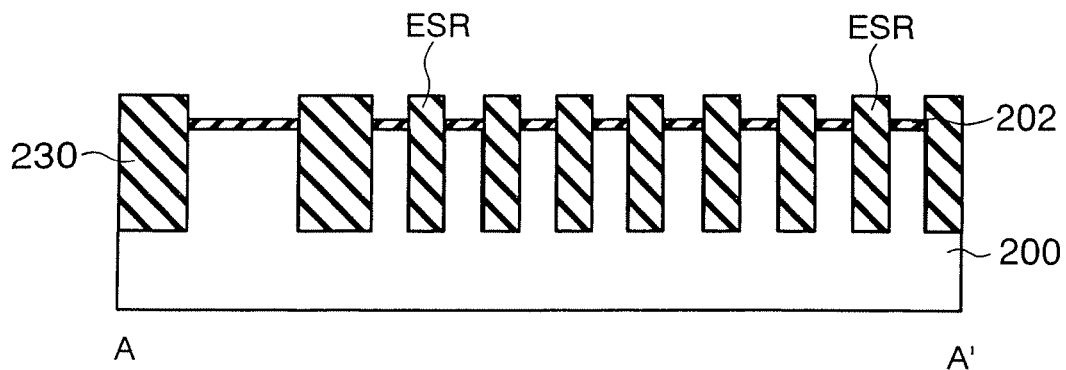
FIG. 76 is a process sectional view for explaining the manufacturing process of the nonvolatile semiconductor memory device according to the second embodiment.
Figure 77:
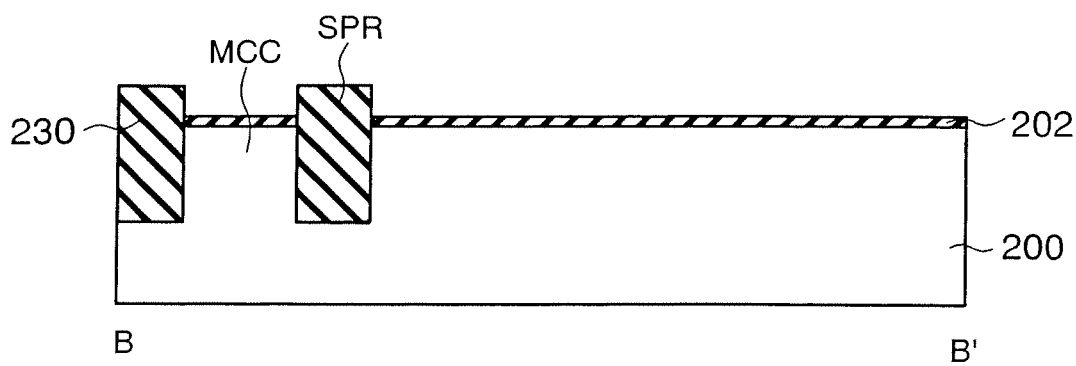
FIG. 77 is a process sectional view for explaining the manufacturing process of the nonvolatile semiconductor memory device according to the second embodiment.
Figure 78:
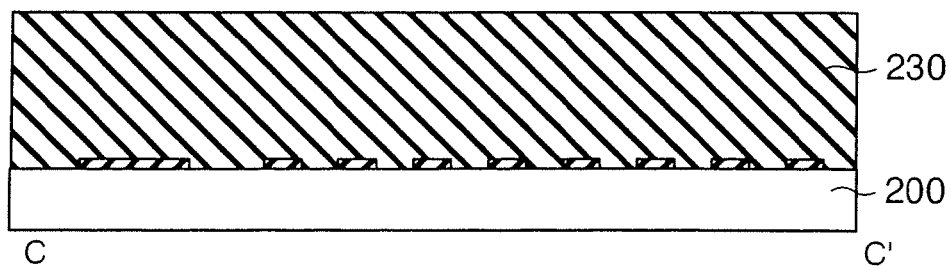
FIG. 78 is a process sectional view for explaining the manufacturing process of the nonvolatile semiconductor memory device according to the second embodiment.

Then, as shown in FIG. 76 to FIG. 78, the silicon nitride film 204 is removed by phosphoric acid treatment. Subsequently, the silicon oxide film 202 is removed by hydrofluoric acid treatment. Consequently, the element separation regions of the nonvolatile semiconductor memory device shown in FIG. 42 to FIG. 45 are obtained.

As described above, according to the nonvolatile semiconductor memory device of this embodiment, by providing the memory cell regions with the memory cell region connecting portion MCC, it becomes possible that in the step of patterning the mask to form the memory cell regions MCR (See FIG. 49 to FIG. 51), a portion where resist pattern collapse tends to occur does not exist in the resist pattern 212. Accordingly, a margin for patterning improves, which makes it possible to provide the stable high-yield nonvolatile semiconductor memory device.

Third Embodiment

In the third embodiment, by forming a bit line connecting portion on one end side of bit lines being a metal wiring layer in a memory cell array region, the occurrence of resist pattern collapse when the bit lines are formed is prevented. Further details will be given below.

Figure 79:
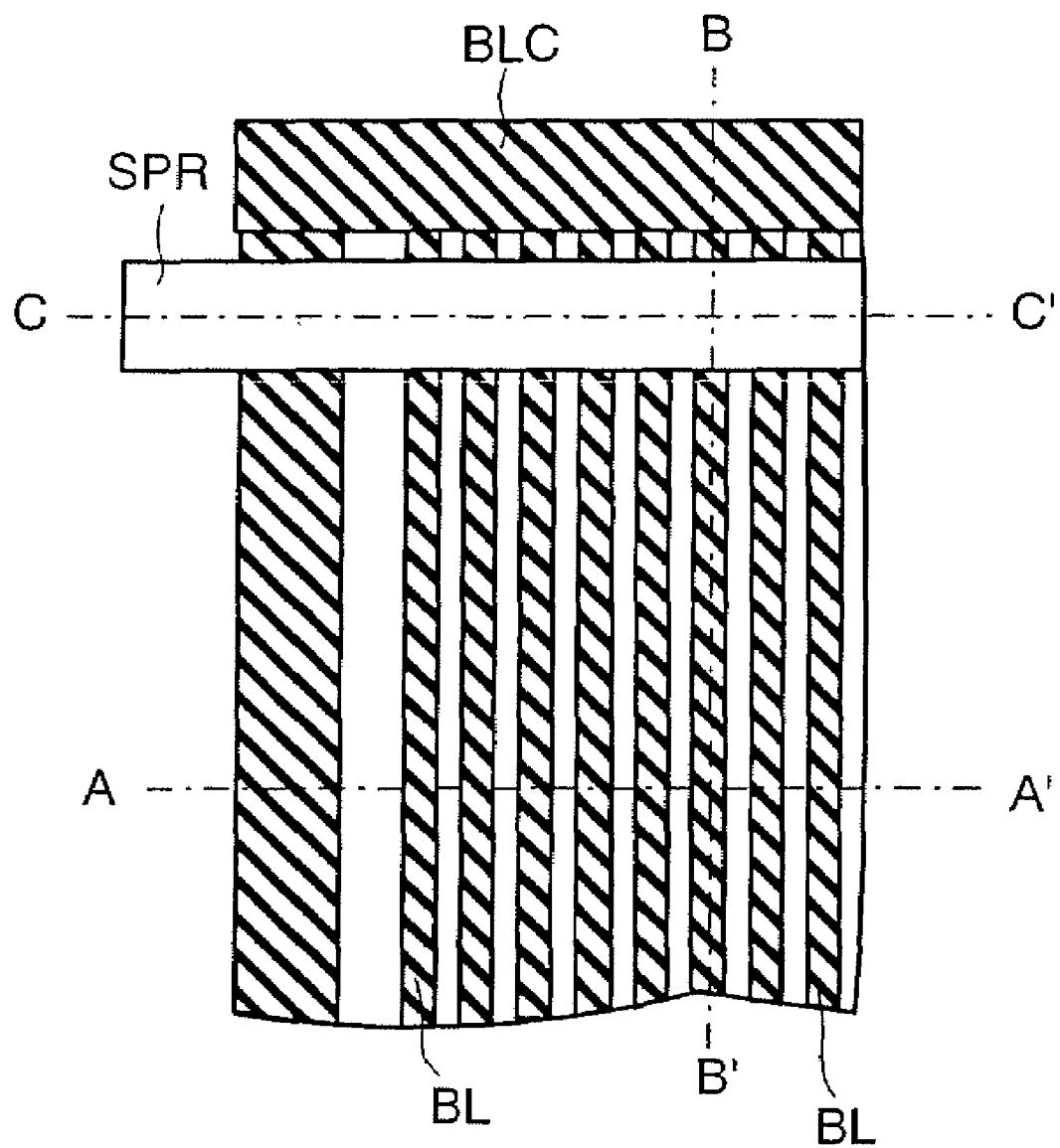
FIG. 79 is a plan view showing the structure of a nonvolatile semiconductor memory device according to a third embodiment.
Figure 80:
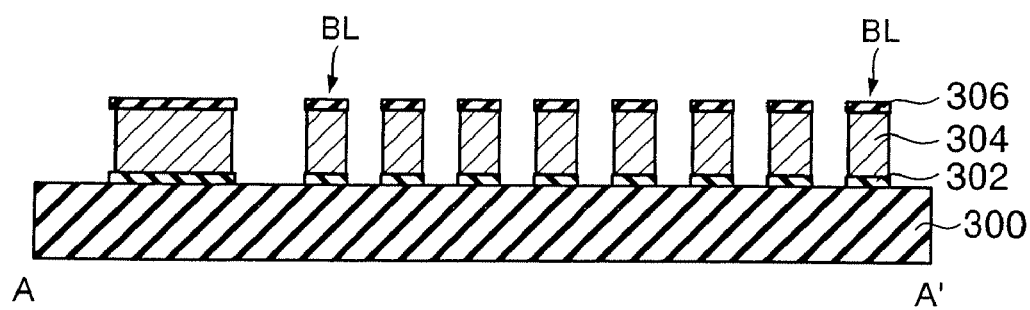
FIG. 80 is a sectional view taken along the line A-A' of FIG. 79 showing the structure of the nonvolatile semiconductor memory device according to the third embodiment.
Figure 81:
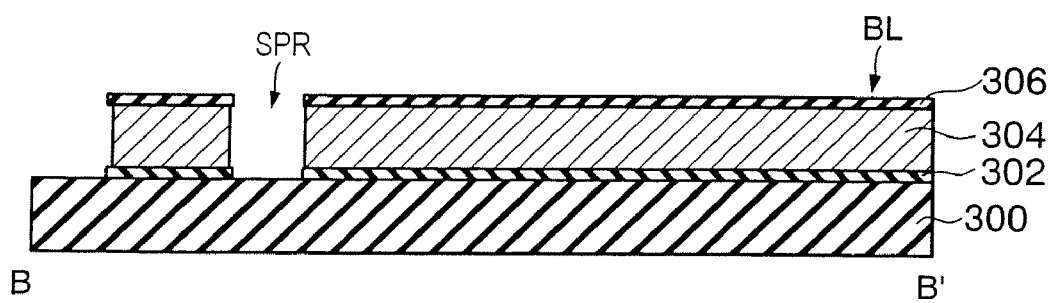
FIG. 81 is a sectional view taken along the line B-B' of FIG. 79 showing the structure of the nonvolatile semiconductor memory device according to the third embodiment.
Figure 82:
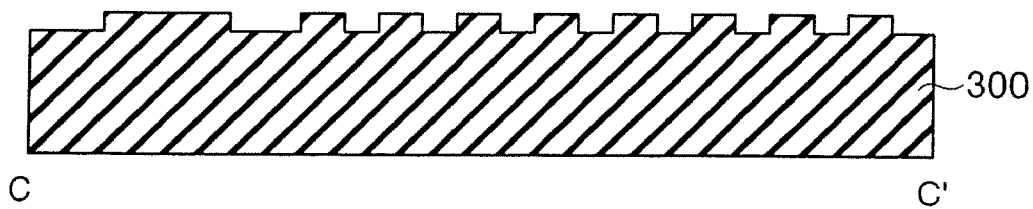
FIG. 82 is a sectional view taken along the line C-C' of FIG. 79 showing the structure of the nonvolatile semiconductor memory device according to the third embodiment.

First, the structure of a NAND-type nonvolatile semiconductor memory device according to this embodiment will be explained based on FIG. 79 to FIG. 82. FIG. 79 is a plan view of the nonvolatile semiconductor memory device according to this embodiment, and FIG. 80 to FIG. 82 are a sectional view taken along the line A-A', a sectional view taken along the line B-B', and a sectional view taken along the line C-C', respectively, of FIG. 79.

As can been seen from these figures, in the nonvolatile semiconductor memory device according to this embodiment, plural bit line BL are formed in parallel in the second direction which is a direction crossing the word lines WL. At end portions of these bit lines BL, a bit line connecting portion BLC which connects respective bit lines BL is formed. The separation pattern region SPR which electrically separates these bit line connecting portion BLC and bit lines BL is formed between the bit line connecting portion BLC and the bit lines BL. Other respects than those described above are the same as in the structure of the normal nonvolatile semiconductor memory device, and hence a detailed explanation thereof is omitted.

Incidentally, the bit lines BL correspond to plural linear patterns in this embodiment, and the bit line connecting portion BLC corresponds to a connecting portion which connects the plural linear patterns in this embodiment.

Next, a manufacturing process of the nonvolatile semiconductor memory device according to this embodiment will be explained based on FIG. 83 to FIG. 100. FIG. 83, FIG. 86, FIG. 89, FIG. 92, FIG. 95, and FIG. 98 are sectional views taken along the line A-A' of FIG. 79 for explaining the manufacturing process, FIG. 84, FIG. 87, FIG. 90, FIG. 93, FIG. 96, and FIG. 99 are sectional views taken along the line B-B' of FIG. 79 for explaining the manufacturing process, and FIG. 85, FIG. 88, FIG. 91, FIG. 94, FIG. 97, and FIG. 100 are sectional views taken along the line C-C' of FIG. 79 for explaining the manufacturing process.

Figure 83:
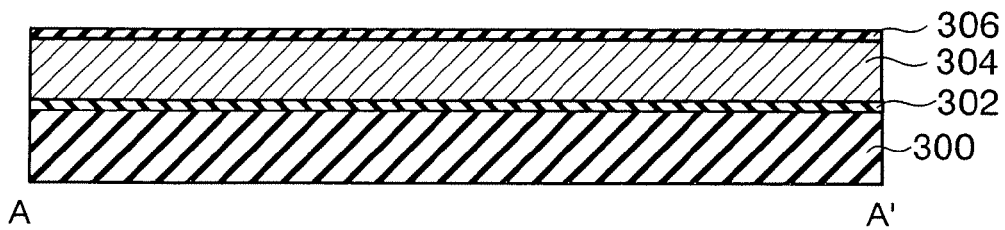
FIG. 83 is a process sectional view for explaining a manufacturing process of the nonvolatile semiconductor memory device according to the third embodiment.
Figure 84:
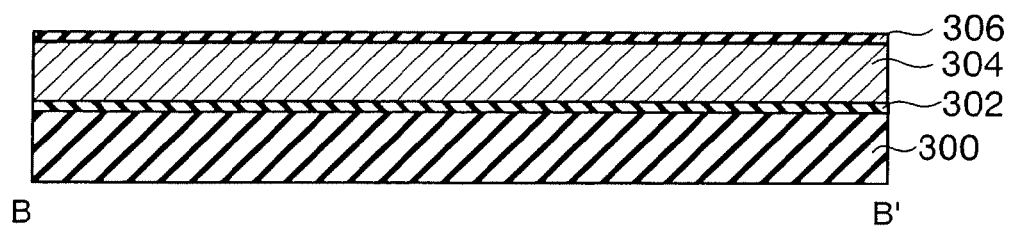
FIG. 84 is a process sectional view for explaining the manufacturing process of the nonvolatile semiconductor memory device according to the third embodiment.
Figure 85:
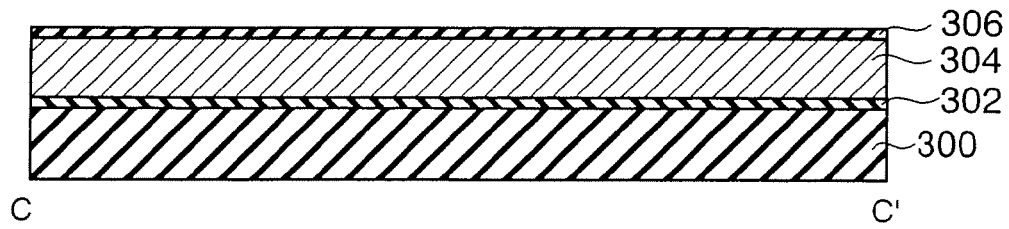
FIG. 85 is a process sectional view for explaining the manufacturing process of the nonvolatile semiconductor memory device according to the third embodiment.

First, as shown in FIG. 83 to FIG. 85, a barrier metal film 302 is formed on an insulating film 300. It is assumed that beneath this insulating film 300, plural word lines and plural memory cells are formed. In this embodiment, the barrier metal layer 302 is composed of a titanium film and a titanium nitride film. Subsequently, an aluminum film 304 is formed on the barrier metal film 302, and a titanium nitride film 306 is formed on the aluminum film 304.

Figure 86:
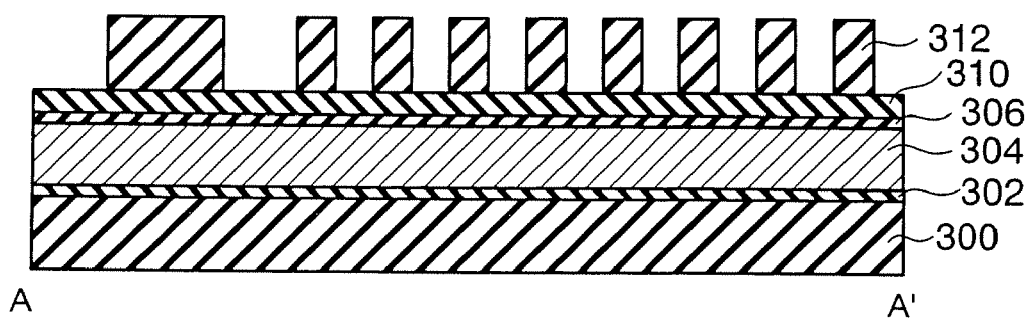
FIG. 86 is a process sectional view for explaining the manufacturing process of the nonvolatile semiconductor memory device according to the third embodiment.
Figure 87:
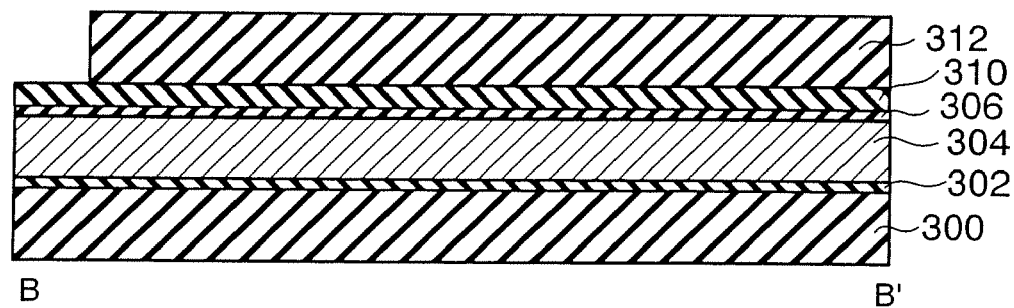
FIG. 87 is a process sectional view for explaining the manufacturing process of the nonvolatile semiconductor memory device according to the third embodiment.
Figure 88:
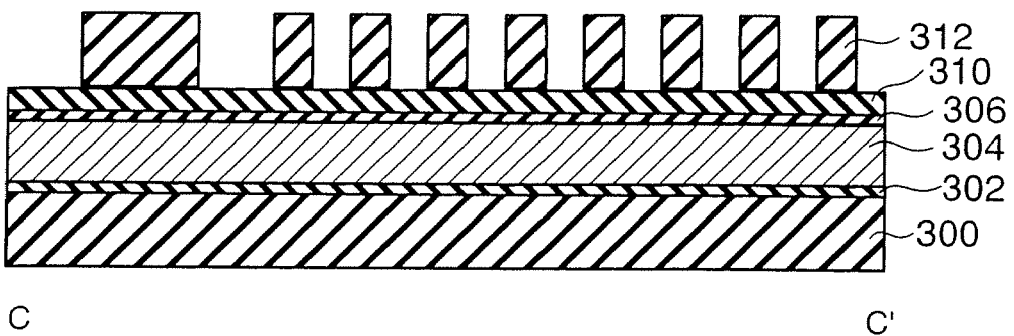
FIG. 88 is a process sectional view for explaining the manufacturing process of the nonvolatile semiconductor memory device according to the third embodiment.

Next, as shown in FIG. 86 to FIG. 88, an antireflection film 310, for example, with a thickness of 10 nm is formed on the titanium nitride film 306, and a photoresist 312, for example, with a thickness of 200 nm is formed on the antireflection film 310. Subsequently, the photoresist 312 is patterned as desired. In this embodiment, the wiring width and space width of the pattern are approximately 90 nm. By this patterning, patterns to form the bit lines BL and a pattern to form the bit line connecting portion BLC are formed in the photoresist 312.

Figure 89:
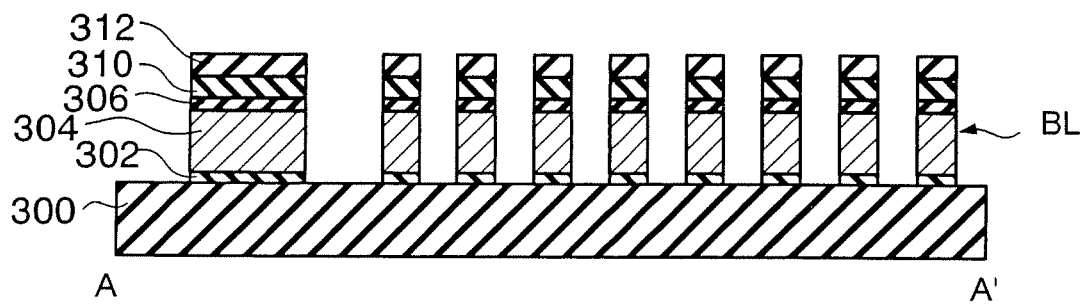
FIG. 89 is a process sectional view for explaining the manufacturing process of the nonvolatile semiconductor memory device according to the third embodiment.
Figure 90:
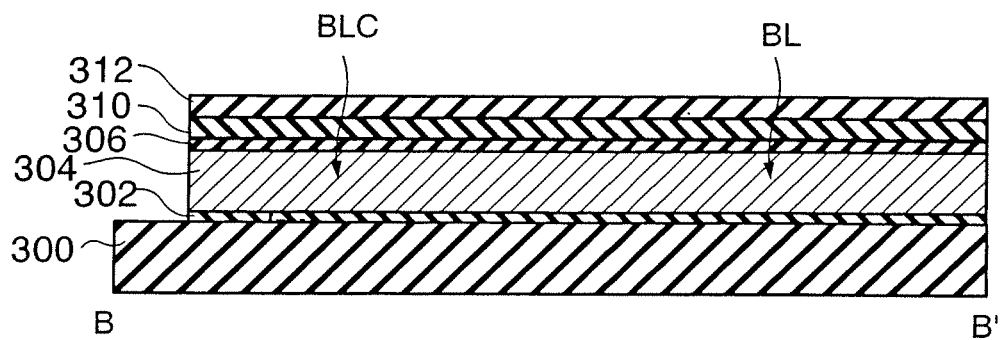
FIG. 90 is a process sectional view for explaining the manufacturing process of the nonvolatile semiconductor memory device according to the third embodiment.
Figure 91:
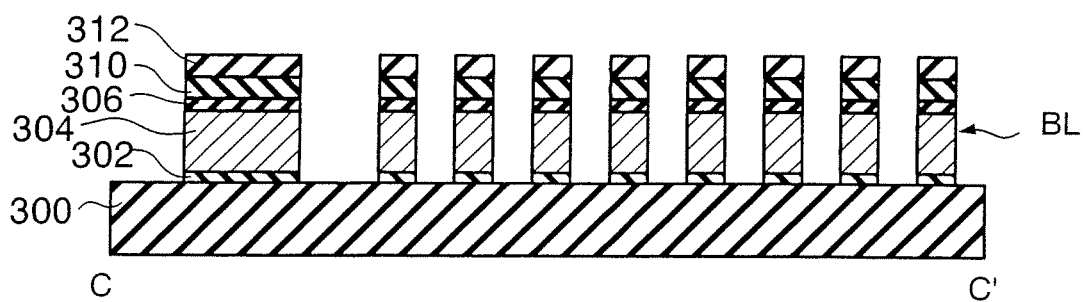
FIG. 91 is a process sectional view for explaining the manufacturing process of the nonvolatile semiconductor memory device according to the third embodiment.

Then, as shown in FIG. 89 to FIG. 91, the antireflection film 310, the titanium nitride film 306, the aluminum film 304, and the barrier metal film 302 are etched by the RIE technology with the photoresist 312 as a mask. By this etching, plural bit lines BL and the bit line connecting portion BLC which connects the plural bit lines BL on one end side of these bit lines are formed. Accordingly, the titanium nitride film 306, the aluminum film 304, and the barrier metal film 302 correspond to a first member to be patterned in this embodiment.

Figure 92:
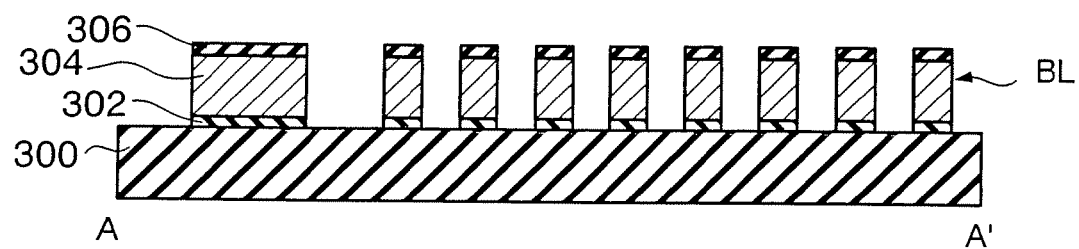
FIG. 92 is a process sectional view for explaining the manufacturing process of the nonvolatile semiconductor memory device according to the third embodiment.
Figure 93:
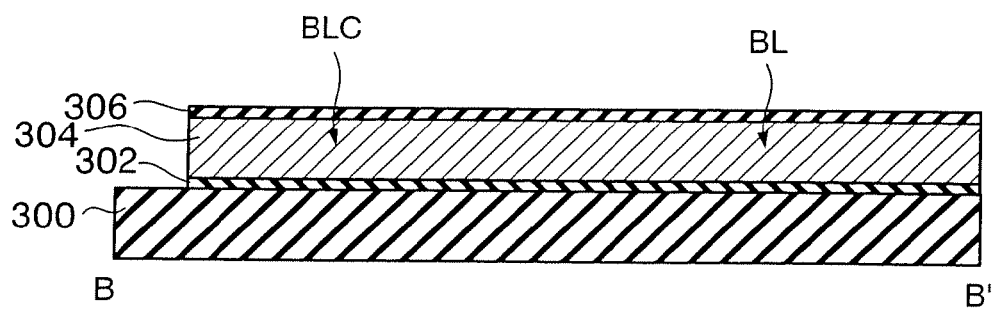
FIG. 93 is a process sectional view for explaining the manufacturing process of the nonvolatile semiconductor memory device according to the third embodiment.
Figure 94:
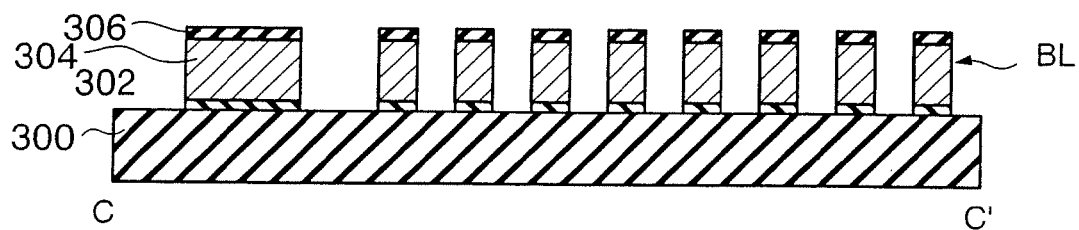
FIG. 94 is a process sectional view for explaining the manufacturing process of the nonvolatile semiconductor memory device according to the third embodiment.

Subsequently, as shown in FIG. 92 to FIG. 94, the antireflection film 310 and the photoresist 312 are removed using the ashing technology.

Figure 95:
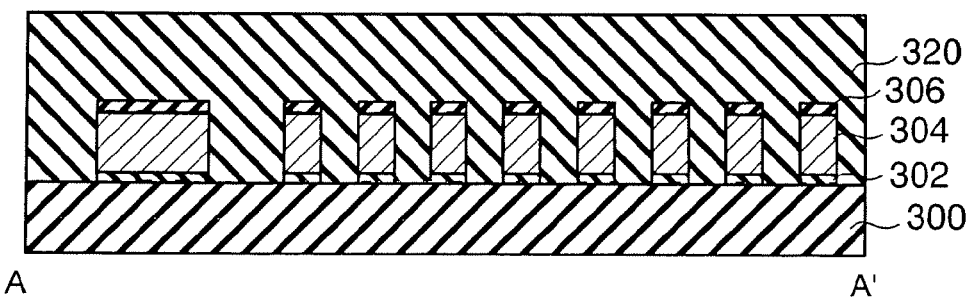
FIG. 95 is a process sectional view for explaining the manufacturing process of the nonvolatile semiconductor memory device according to the third embodiment.
Figure 96:
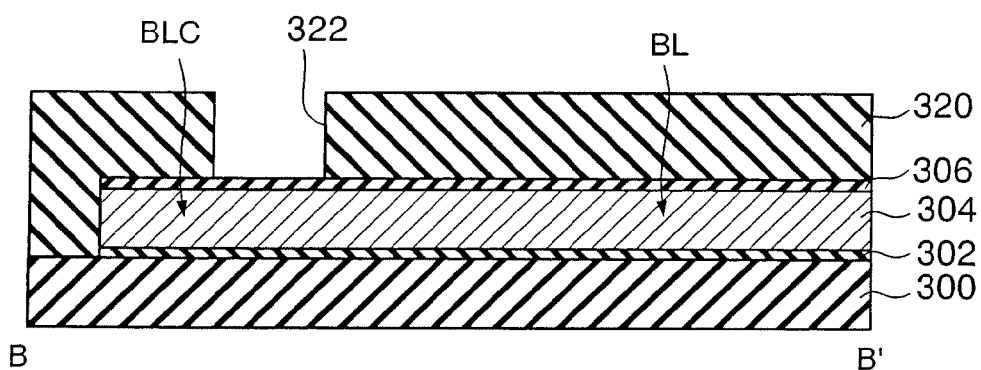
FIG. 96 is a process sectional view for explaining the manufacturing process of the nonvolatile semiconductor memory device according to the third embodiment.
Figure 97:
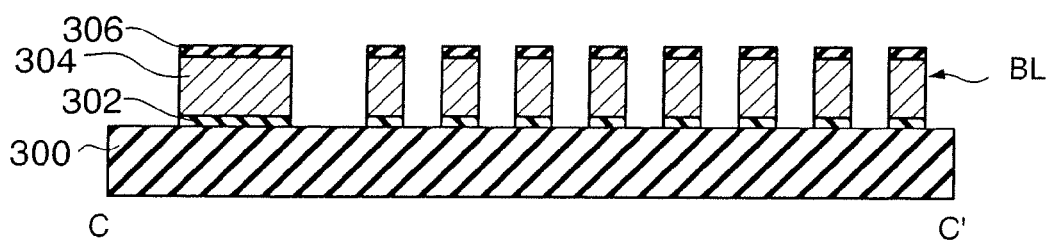
FIG. 97 is a process sectional view for explaining the manufacturing process of the nonvolatile semiconductor memory device according to the third embodiment.

Thereafter, as shown in FIG. 95 to FIG. 97, after a photoresist 320, for example, with a thickness of 100 nm is formed on this nonvolatile semiconductor memory device, the photoresist 320 is patterned as desired by the lithography technology. By this patterning, an opening 322 is formed in a portion corresponding to the separation pattern region SPR in the photoresist 320.

Figure 98:
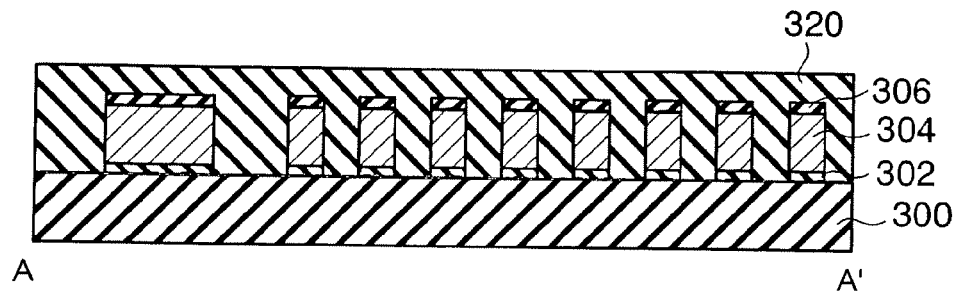
FIG. 98 is a process sectional view for explaining the manufacturing process of the nonvolatile semiconductor memory device according to the third embodiment.
Figure 99:
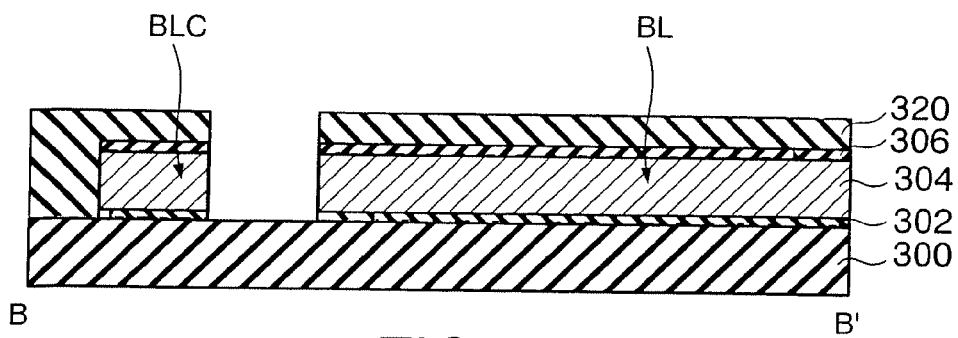
FIG. 99 is a process sectional view for explaining the manufacturing process of the nonvolatile semiconductor memory device according to the third embodiment.
Figure 100:
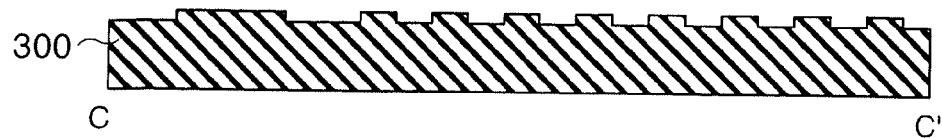
FIG. 100 is a process sectional view for explaining the manufacturing process of the nonvolatile semiconductor memory device according to the third embodiment.

Next, as shown in FIG. 98 to FIG. 100, the titanium nitride film 306, the aluminum film 304, and the barrier metal film 302 are etched using the RIE technology with the photoresist 320 as a mask. Thereby, the separation pattern region SPR is formed, so that the bit lines BL and the bit line connecting portion BLC in the memory cell array region are electrically separated. Then, the photoresist 320 is removed using the ashing technology, and a wiring process is completed. Consequently, the nonvolatile semiconductor memory device shown in FIG. 79 to FIG. 82 is obtained.

As described above, according to the nonvolatile semiconductor memory device of this embodiment, by providing the bit line connecting portion BLC on one end side of the bit lines BL, it becomes possible that when the bit lines BL are formed by etching with the photoresist 312 as a mask, a portion such as a tip of the bit line BL where resist pattern collapse tends to occur does not exist. Accordingly, a margin for patterning improves, which makes it possible to provide the stable high-yield nonvolatile semiconductor memory device.

Figure 101:
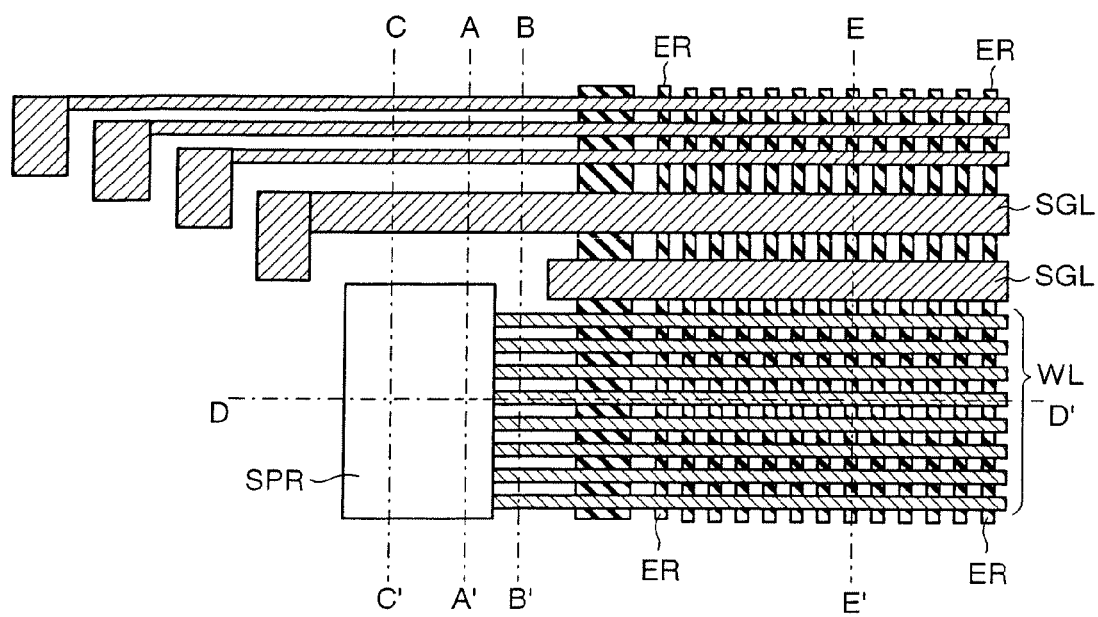
FIG. 101 is a view corresponding to FIG. 1 for explaining a modification of the first embodiment.
Figure 102:
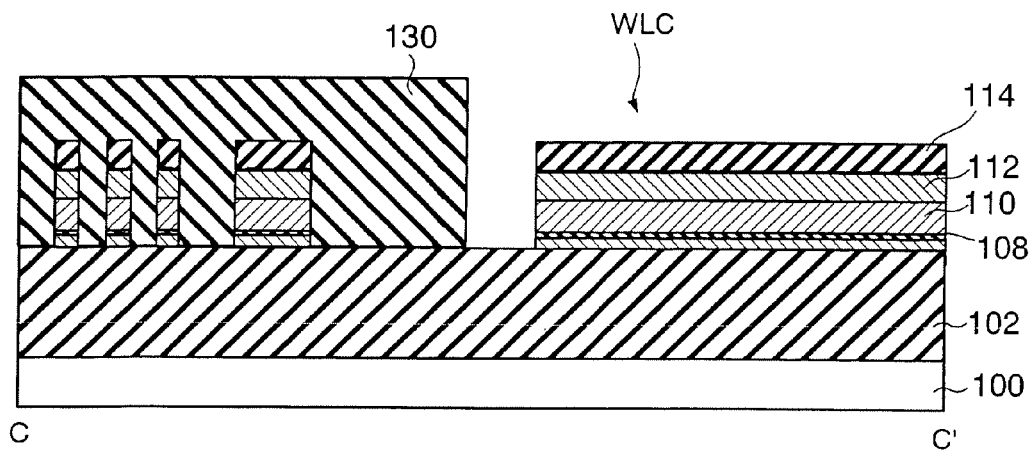
FIG. 102 is a view corresponding to FIG. 34 for explaining the modification of the first embodiment.
Figure 103:
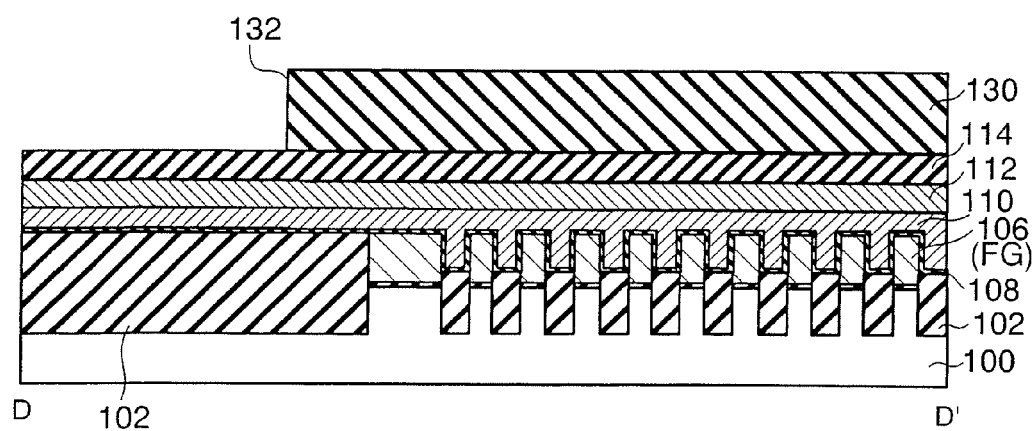
FIG. 103 is a view corresponding to FIG. 35 for explaining the modification of the first embodiment.
Figure 104:
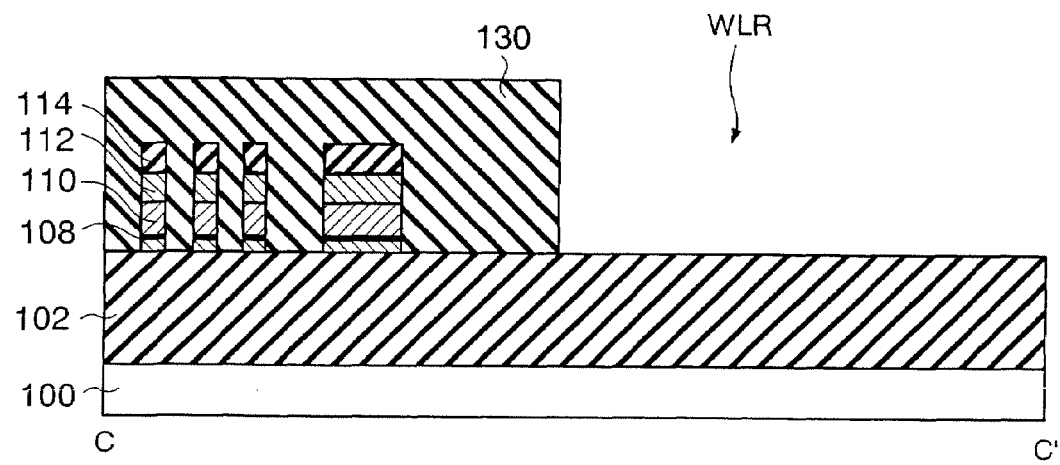
FIG. 104 is a view corresponding to FIG. 39 for explaining the modification of the first embodiment.
Figure 105:
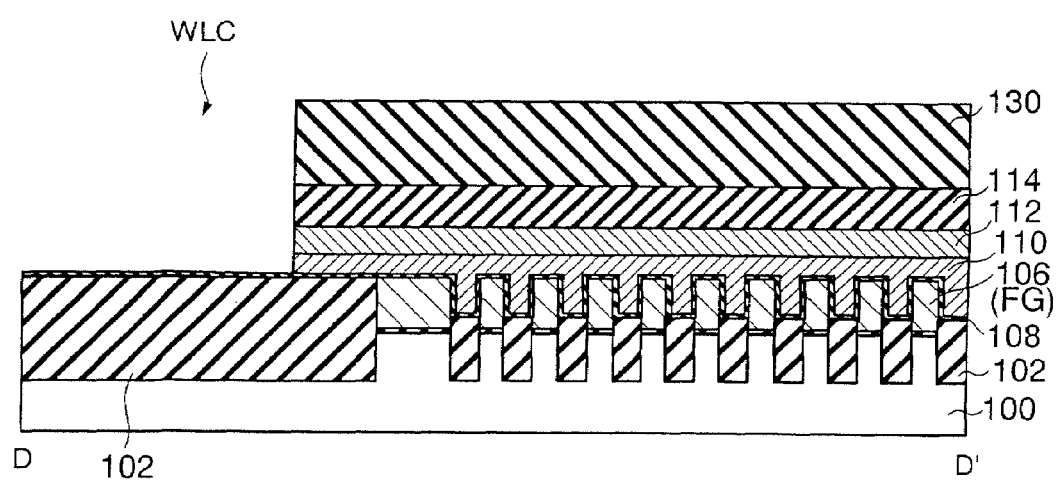
FIG. 105 is a view corresponding to FIG. 40 for explaining the modification of the first embodiment.

It should be mentioned that the present invention is not limited to the aforementioned embodiments, and various changes may be made therein. For example, in the aforementioned embodiments, the word line connecting portion WLC, the memory cell region connecting portion MCC, and the bit line connecting portion BLC are finally left, but they need not necessarily be left. For example, in the first embodiment, as shown in FIG. 101, it is also possible to extend the separation pattern region SPR to a region where the word line connecting portion WLC is provided and remove the word line connecting portion WLC. In this case, as shown in FIG. 102 (which corresponds to FIG. 34) and FIG. 103 (which corresponds to FIG. 35), the opening 132 of the photoresist 130 is formed widely so as to contain all of the word line connecting portion WLC. Then, as shown in FIG. 104 (which corresponds to FIG. 39) and FIG. 105 (which corresponds to FIG. 40), the separation pattern region SPR is formed by removing also the portion of the word line connecting portion WLC when the silicon nitride film 114, the tungsten silicide film 112, and the polycrystalline silicon film 110 are removed by etching with the photoresist 130 as a mask.

Figure 106:
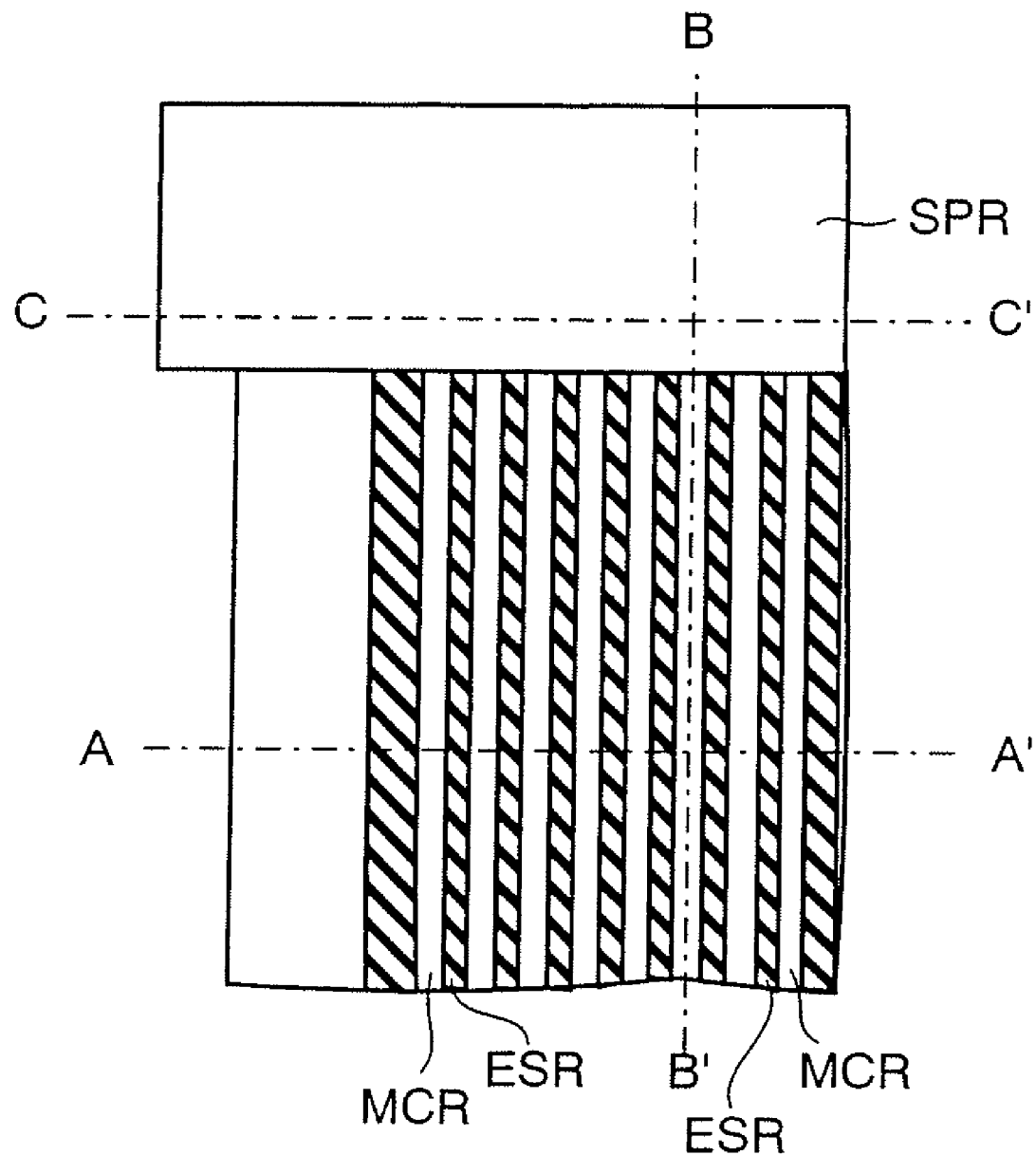
FIG. 106 is a view corresponding to FIG. 42 for explaining a modification of the second embodiment.
Figure 107:
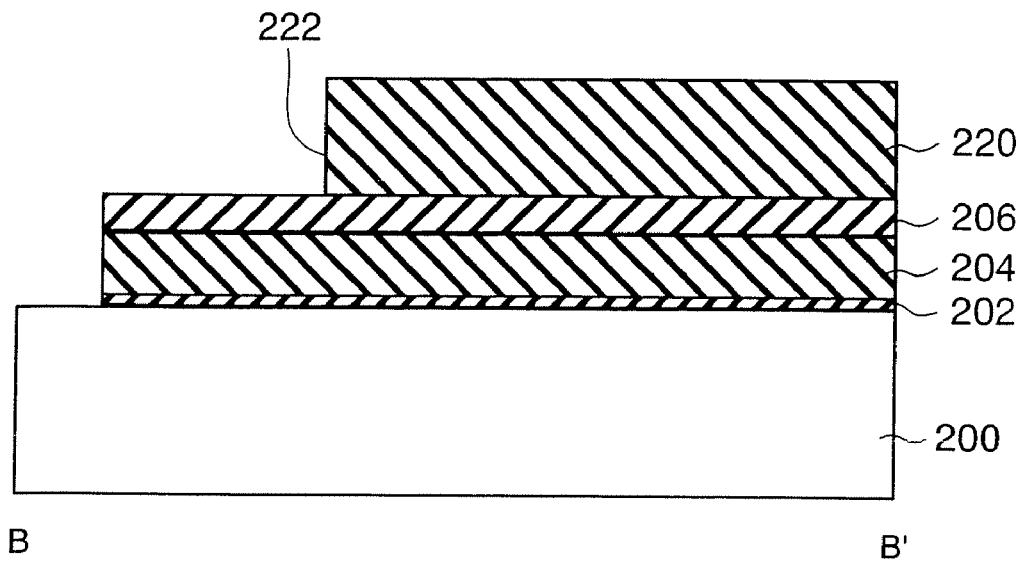
FIG. 107 is a view corresponding to FIG. 59 for explaining the modification of the second embodiment.
Figure 108:
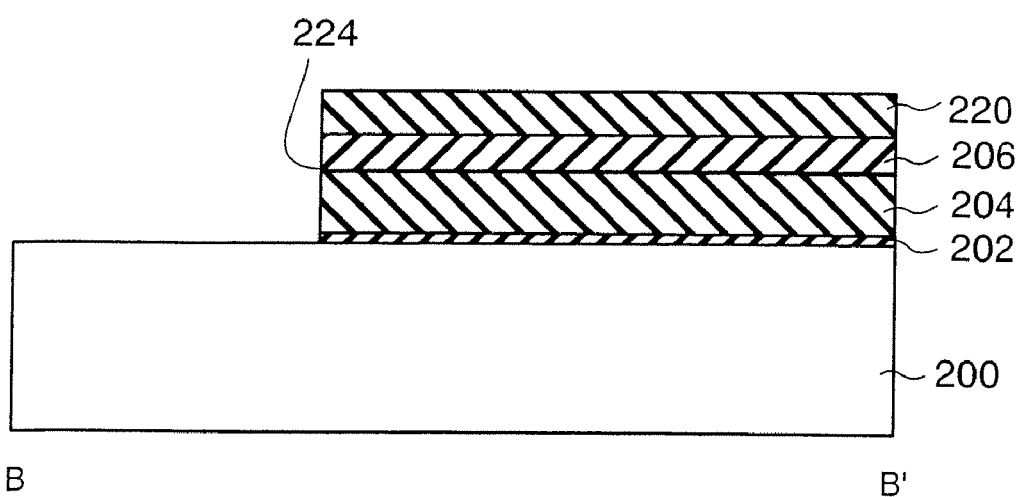
FIG. 108 is a view corresponding to FIG. 62 for explaining the modification of the second embodiment.
Figure 109:
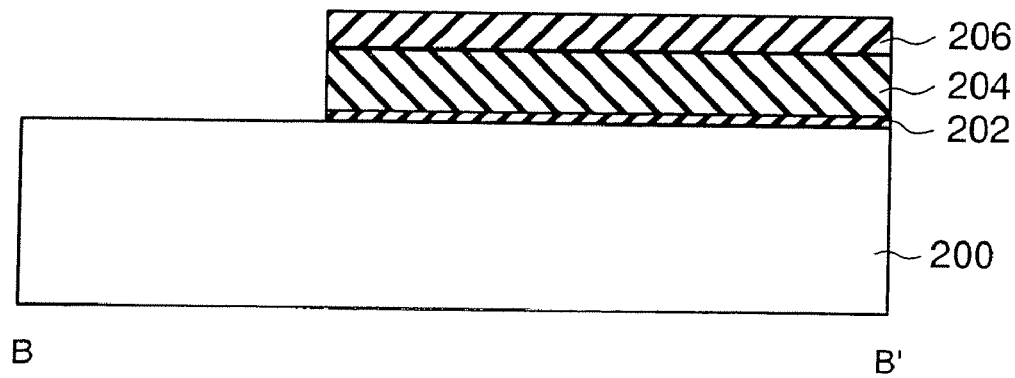
FIG. 109 is a view corresponding to FIG. 65 for explaining the modification of the second embodiment.
Figure 110:
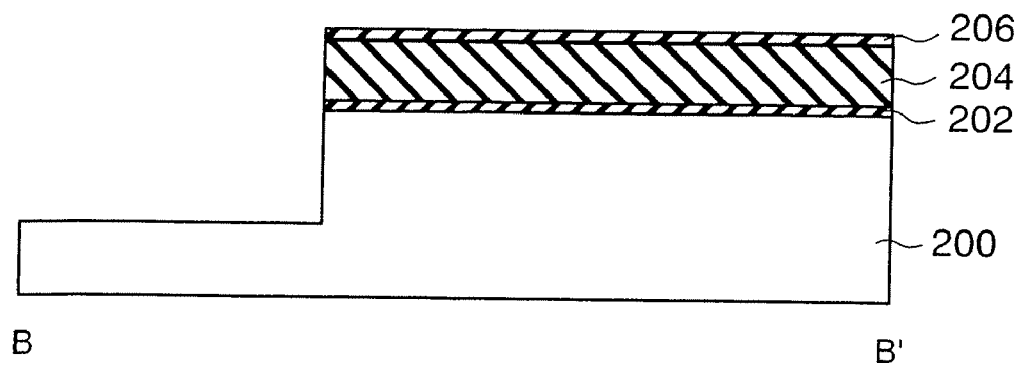
FIG. 110 is a view corresponding to FIG. 68 for explaining the modification of the second embodiment.

Moreover, in the second embodiment, as shown in FIG. 106, it is also possible to extend the separation pattern region SPR to a region where the memory cell region connecting portion MCC is provided and remove the memory cell region connecting portion MCC. In this case, as shown in FIG. 107 (which corresponds to FIG. 59), the opening 222 of the photoresist 220 is formed widely so as to contain all of the memory cell region connecting portion MCC. Then, as shown in FIG. 108 (which corresponds to FIG. 62), when the silicon oxide film 206, the silicon nitride film 204, and the silicon oxide film 202 are removed by etching with the photoresist 220 as a mask, the memory cell region connecting portion MCC is also removed. Subsequently, as shown in FIG. 109 (which corresponds to FIG. 65), the photoresist 220 is removed, and as shown in FIG. 110 (FIG. 68), a trench to form the separation pattern region SPR is formed in the semiconductor substrate 200 by etching the semiconductor substrate 200 with the silicon oxide film 206 as a mask.

Figure 111:
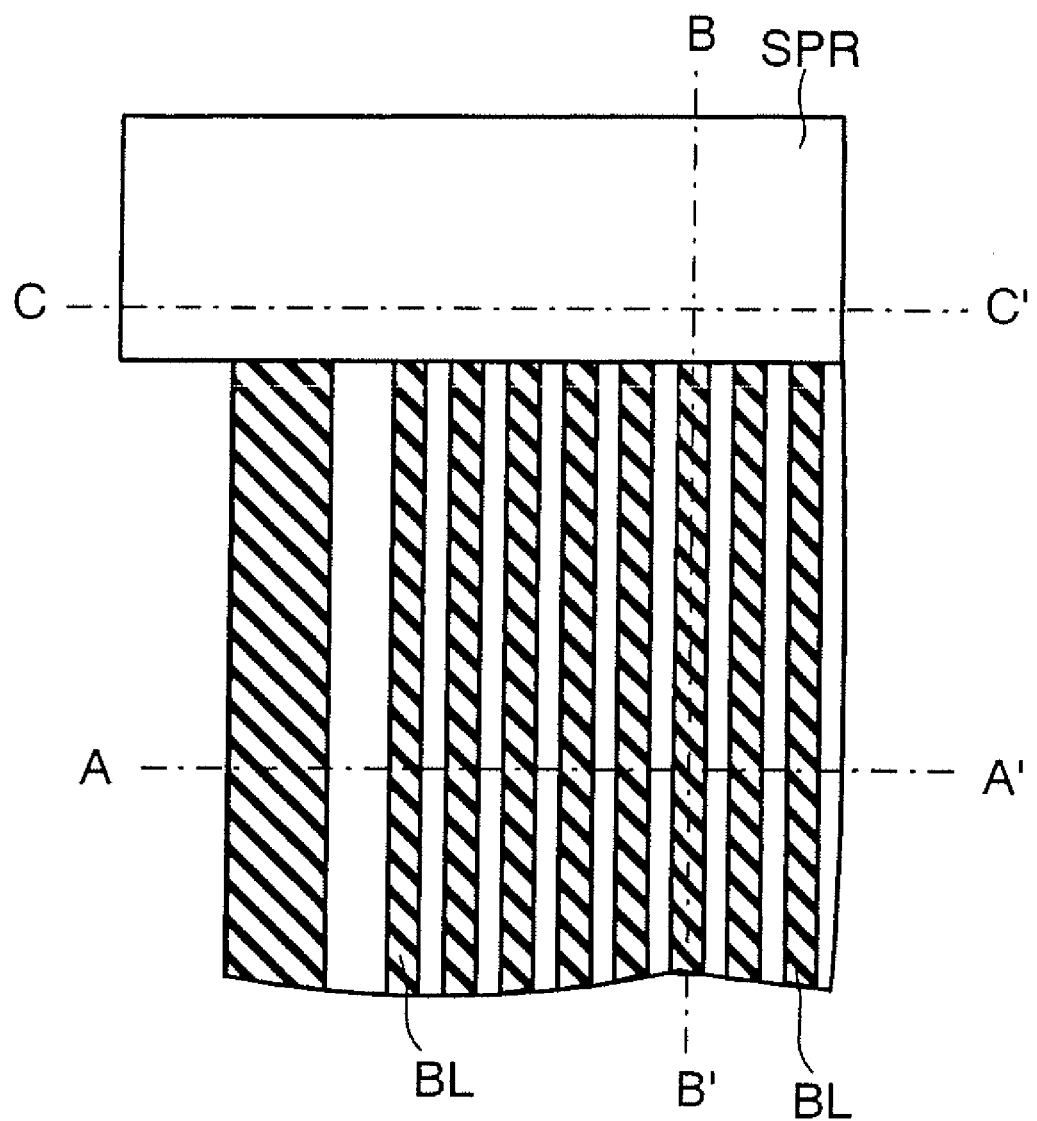
FIG. 111 is a view corresponding to FIG. 79 for explaining a modification of the third embodiment.
Figure 112:
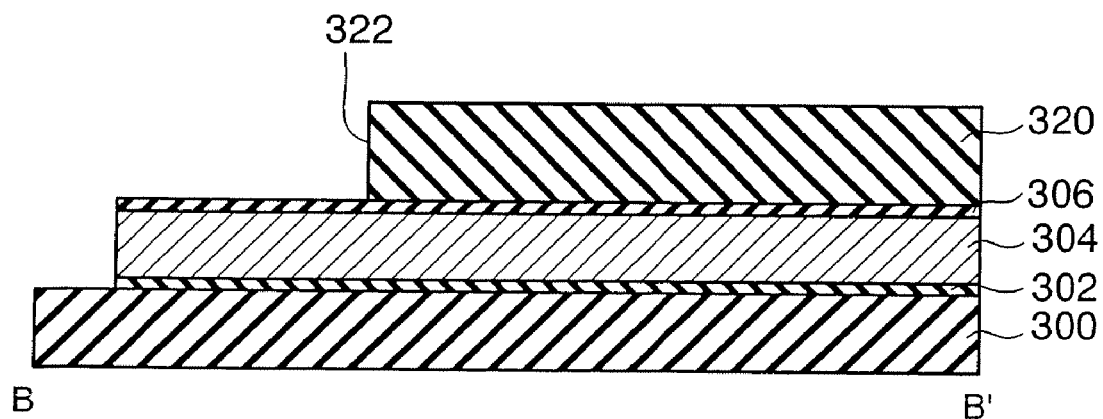
FIG. 112 is a view corresponding to FIG. 96 for explaining the modification of the third embodiment.
Figure 113:
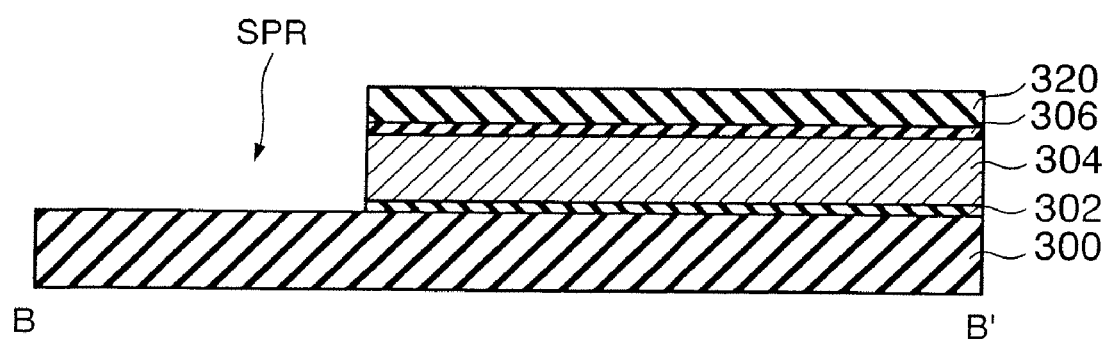
FIG. 113 is a view corresponding to FIG. 99 for explaining the modification of the third embodiment.

Further, in the third embodiment, as shown in FIG. 111, it is also possible to extend the separation pattern region SPR to a region where the bit line connecting portion BLC is provided and remove the bid line connecting portion BLC. In this case, as shown in FIG. 112 (which corresponds to FIG. 96), the opening 322 of the photoresist 320 is formed widely so as to contain all of the bid line connecting portion BLC. Then, as shown in FIG. 113 (which corresponds to FIG. 99), the separation pattern region SPR is formed by removing also the portion of the bid line connecting portion BLC when the titanium nitride film 306, the aluminum film 304, and the barrier metal film 302 are removed by etching with the photoresist 320 as a mask.

Furthermore, although all of each of the word line connecting portion WLC, the memory cell region connecting portion MCC, and the bit line connecting portion BLC is removed in these modifications, only a part thereof may be removed.

Additionally, in the aforementioned embodiments, the present invention is explained with the NAND-type nonvolatile semiconductor memory device as an example, but the present invention is also applicable to other semiconductor devices such as a semiconductor memory device including word lines and bit lines. Namely, the present invention is applicable to all of semiconductor devices having a linear pattern such as causes resist pattern collapse.

Besides, in the aforementioned embodiments, only on one end side of the linear pattern, the connection portion which connects the plural linear patterns is provided, but the connecting portions may be provided on both end sides of the linear pattern.

What is claimed is:

1. A manufacturing method of a semiconductor device, comprising:
    forming a first member to be patterned on a semiconductor substrate;
    patterning the first member to a plurality of parallel linear pattern and a connecting portion which connects the linear patterns on at least one end side of the linear patterns; and
    removing the connecting portion.

2. The manufacturing method of the semiconductor device according to claim 1, wherein, the removing the connecting portion comprising:
    forming a photoresist having an opening which contains the connecting portion;
    etching the connecting portion with the photoresist as a mask to remove the connecting portion.

3. The manufacturing method of the semiconductor device according to claim 1, wherein the first member to be patterned is formed by a conductive member.

4. The manufacturing method of the semiconductor device according to claim 3, wherein the linear patterns are for word lines.

5. The manufacturing method of the semiconductor device according to claim 4, wherein the word lines are for a memory cell array in a nonvolatile semiconductor memory device.

6. The manufacturing method of the semiconductor device according to claim 3, wherein the linear patterns are for bit lines.

7. The manufacturing method of the semiconductor device according to claim 6, wherein the bit lines are for a memory cell array in a nonvolatile semiconductor memory device.

8. The manufacturing method of the semiconductor device according to claim 1, wherein the first member to be patterned is formed by a mask member for patterning.

9. The manufacturing method of the semiconductor device according to claim 8, further comprising etching a second member to be patterned with the first member to be patterned as a mask, the second member to be patterned being provided beneath the first member to be patterned.

10. The manufacturing method of the semiconductor device according to claim 9, wherein the second member to be patterned is a semiconductor substrate, and in the step of etching the semiconductor substrate, a trench to embed an element separation insulating film therein is formed.

* * * * *